United States Patent [19]

Iwahashi et al.

[11] Patent Number: 5,336,952
[45] Date of Patent: Aug. 9, 1994

[54] SEMICONDUCTOR INTEGRATED CIRCUIT PROTECTED FROM ELEMENT BREAKDOWN BY REDUCING THE ELECTRIC FIELD BETWEEN THE GATE AND DRAIN OR SOURCE OF A FIELD EFFECT TRANSISTOR

[75] Inventors: Hiroshi Iwahashi; Toshiyuki Fujimoto, both of Yokohama; Akira Narita, Kawasaki, all of Japan

[73] Assignee: Kabushiki Kaisha Toshiba, Kawasaki, Japan

[21] Appl. No.: 67,102

[22] Filed: May 26, 1993

Related U.S. Application Data

[63] Continuation of Ser. No. 401,923, Sep. 1, 1989, abandoned.

[30] Foreign Application Priority Data

Sep. 2, 1988 [JP] Japan ................ 63-220226

[51] Int. Cl.⁵ ............... H03K 17/687; G11C 16/06
[52] U.S. Cl. ................... 307/571; 365/185;
365/226; 365/230.06; 365/189.09; 307/572;
307/296.4; 307/296.5; 307/584
[58] Field of Search ............. 365/184, 185, 189.09,
365/226, 230.06; 307/296.1, 296.5, 296.6, 296.8,
571, 572, 584, 296.4

[56] References Cited

U.S. PATENT DOCUMENTS

| | | | |
|---|---|---|---|
| 4,689,504 | 8/1987 | Raghunathan et al. | 307/264 |
| 4,697,101 | 9/1987 | Iwahashi et al. | 307/296.1 |
| 4,823,318 | 4/1989 | D'Arrigo et al. | 365/185 |
| 4,827,451 | 5/1989 | Marquot et al. | 365/189.01 |
| 4,835,423 | 5/1989 | de Ferron et al. | 365/226 |
| 4,893,275 | 1/1990 | Tanaka et al. | 365/230.06 |
| 4,916,334 | 9/1990 | Minagawa et al. | 365/230.06 |
| 4,988,894 | 1/1991 | Takiba et al. | 307/296.1 |

OTHER PUBLICATIONS

"A 95ns 256K CMOS EPROM," K. Yoshzaki et al, Digest of Technical Papers, IEEE Solid State Circuits Conference, Feb. 14, 1985, pp. 166-167.

*Primary Examiner*—Glenn Gossage
*Attorney, Agent, or Firm*—Finnegan, Henderson Farabow, Garrett & Dunner

[57] ABSTRACT

A semiconductor integrated circuit which is protected from element breakdown includes a memory cell, series-connected first and second program load transistors arranged between the memory cell and the program power source, a boosting circuit for outputting a board voltage higher than the voltage of a program power source, and a controller. The controller applies the boosted voltage to the gates of the first and second program load transistors when program data is set at a first logic level. The controller applies a voltage of about 0 V to the gate of the first program load transistor and an intermediate voltage lower than the voltage of the program power source and higher than 0 V to the gate of the second load transistor when the program data is set at a second logic level.

5 Claims, 34 Drawing Sheets

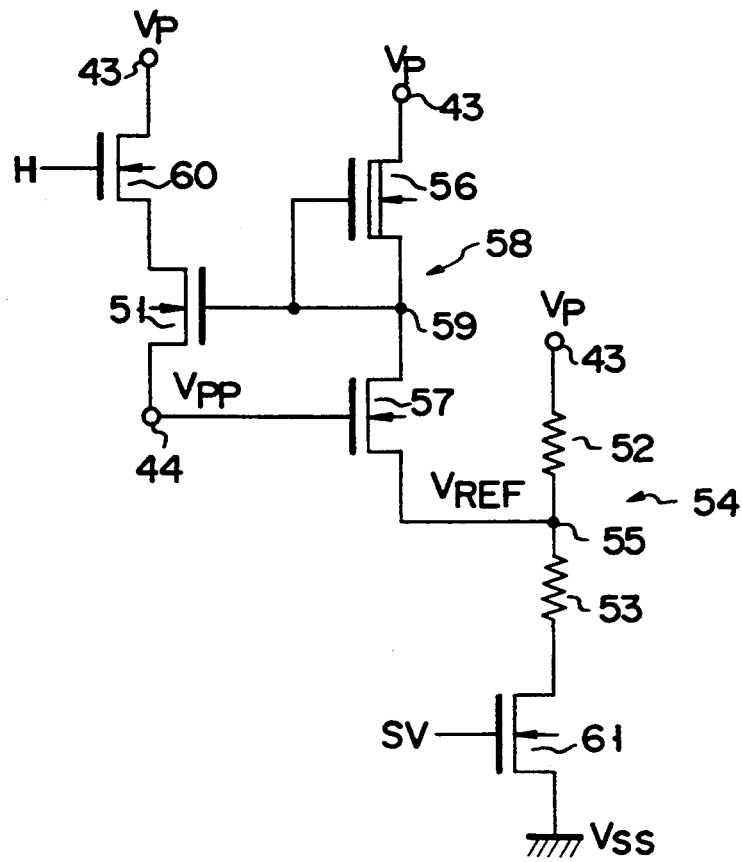
F I G. 6

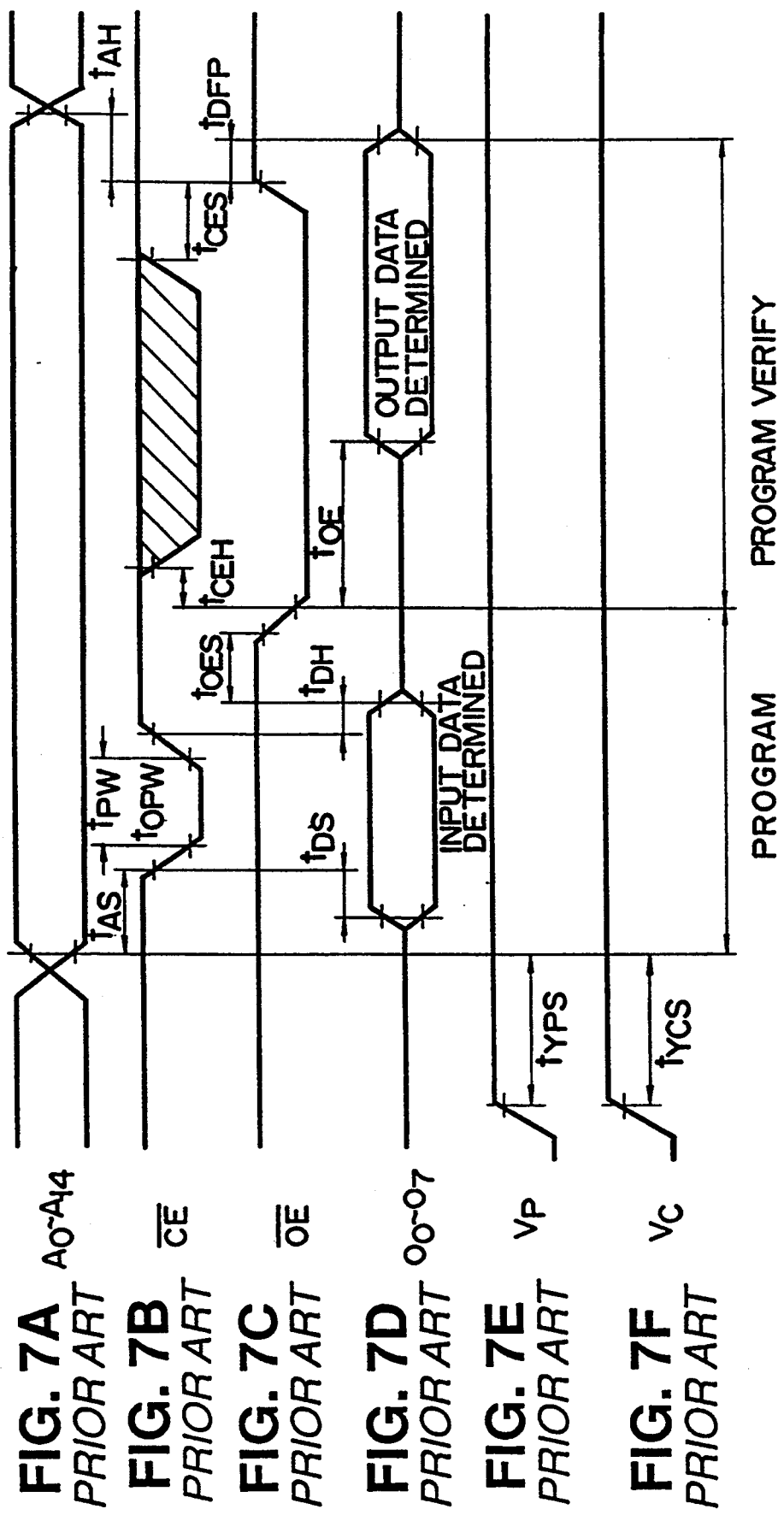

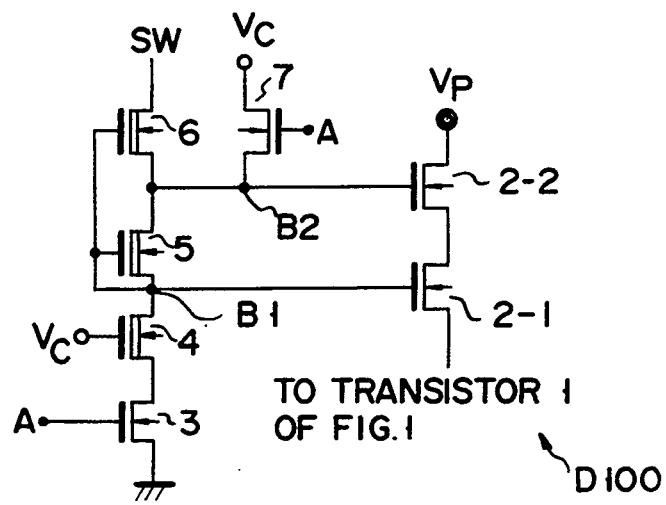
F I G. 9
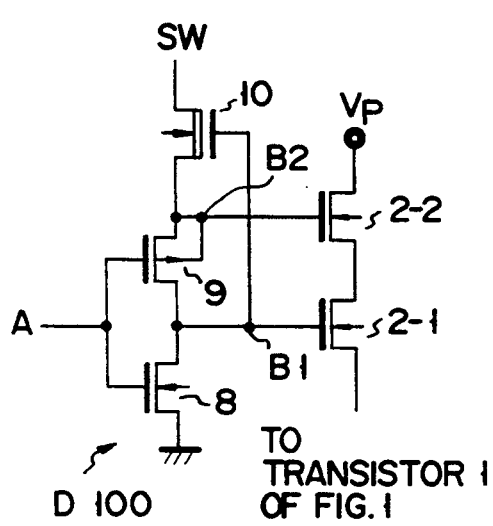
F I G. 10
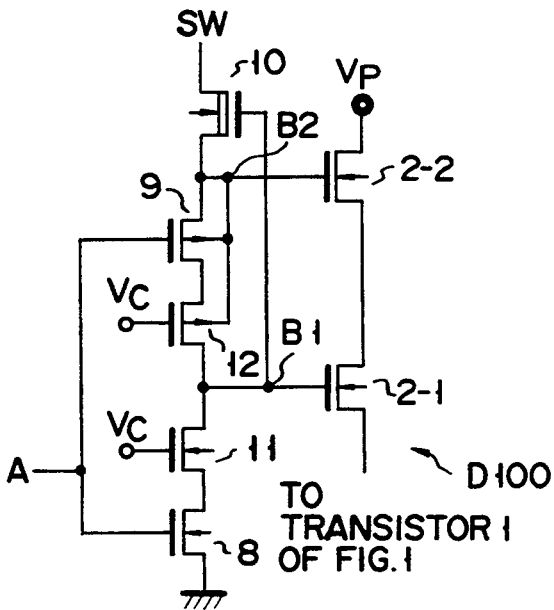
F I G. 11

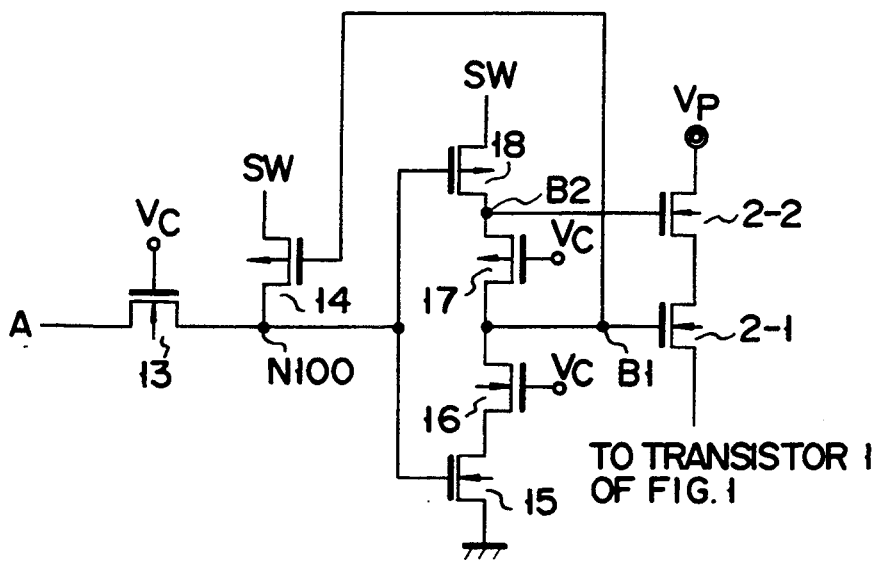
F I G. 12
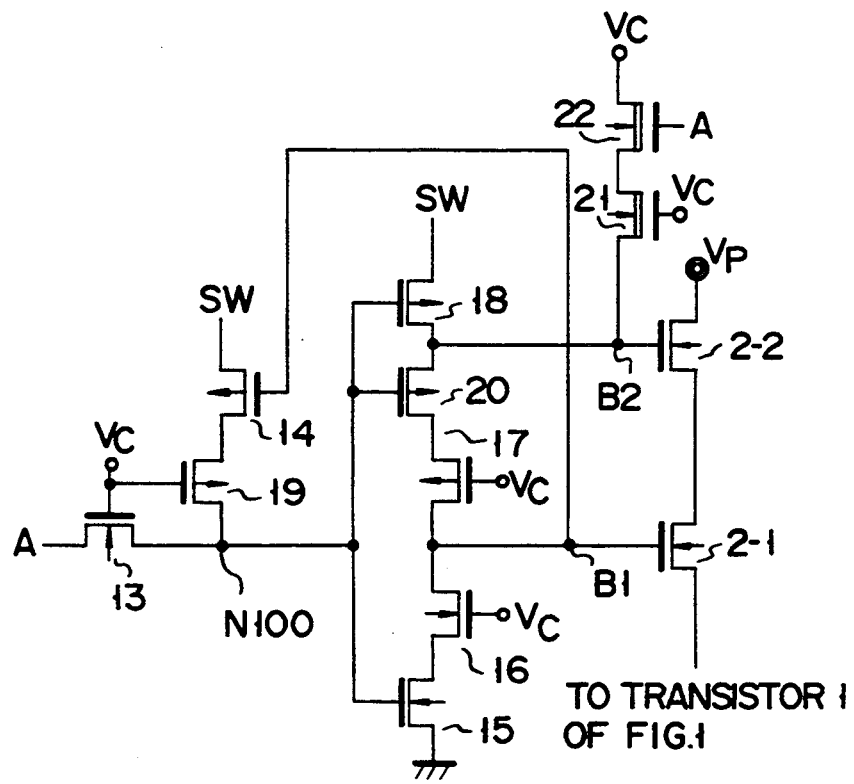
F I G. 13

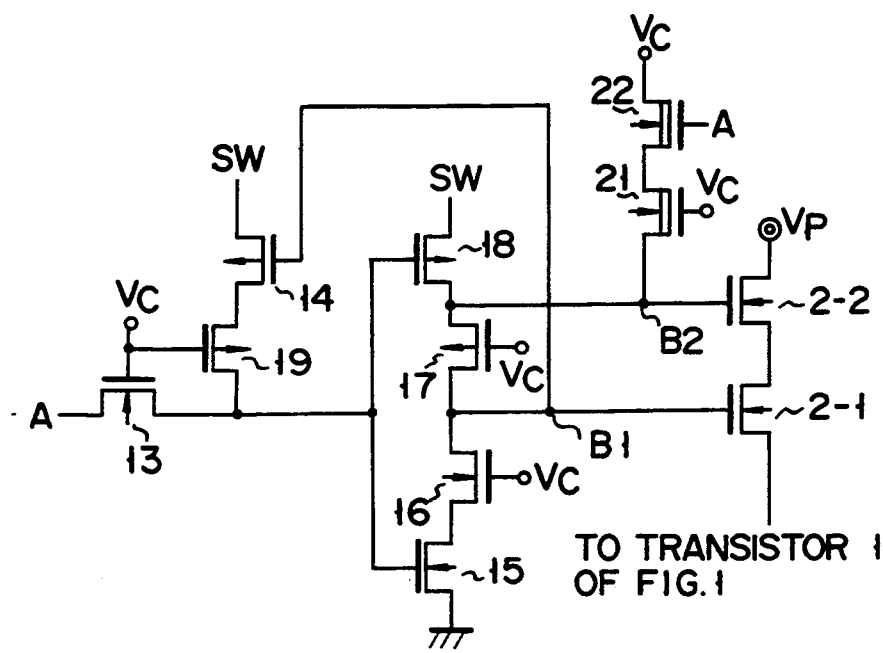
F I G. 14
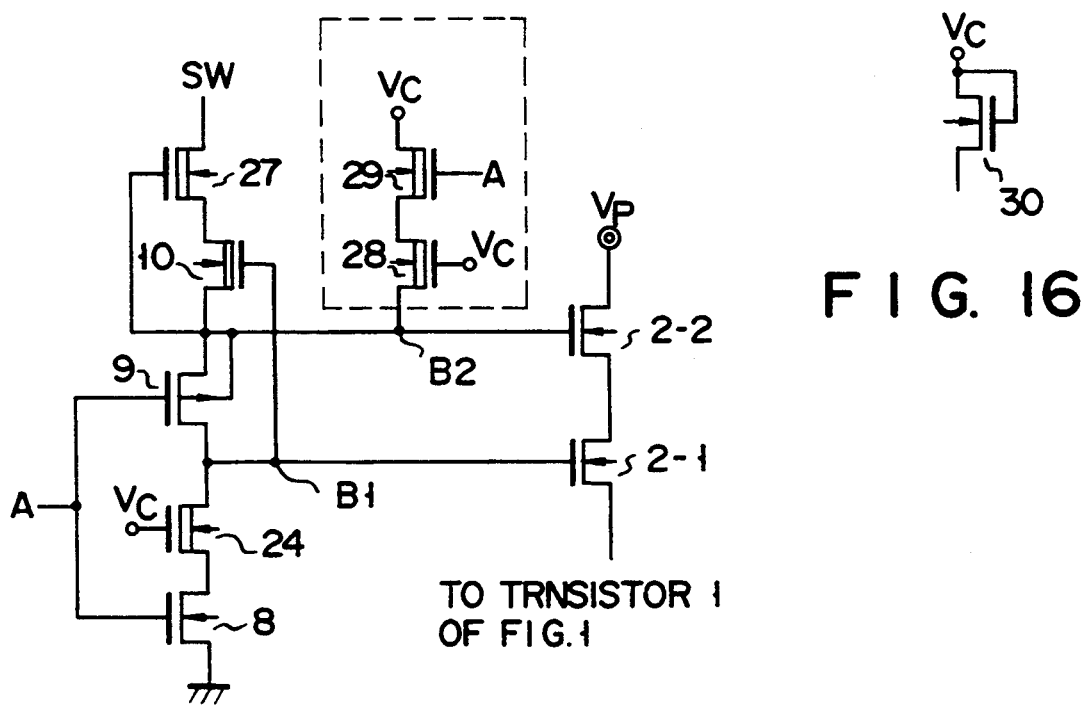
F I G. 15
F I G. 16

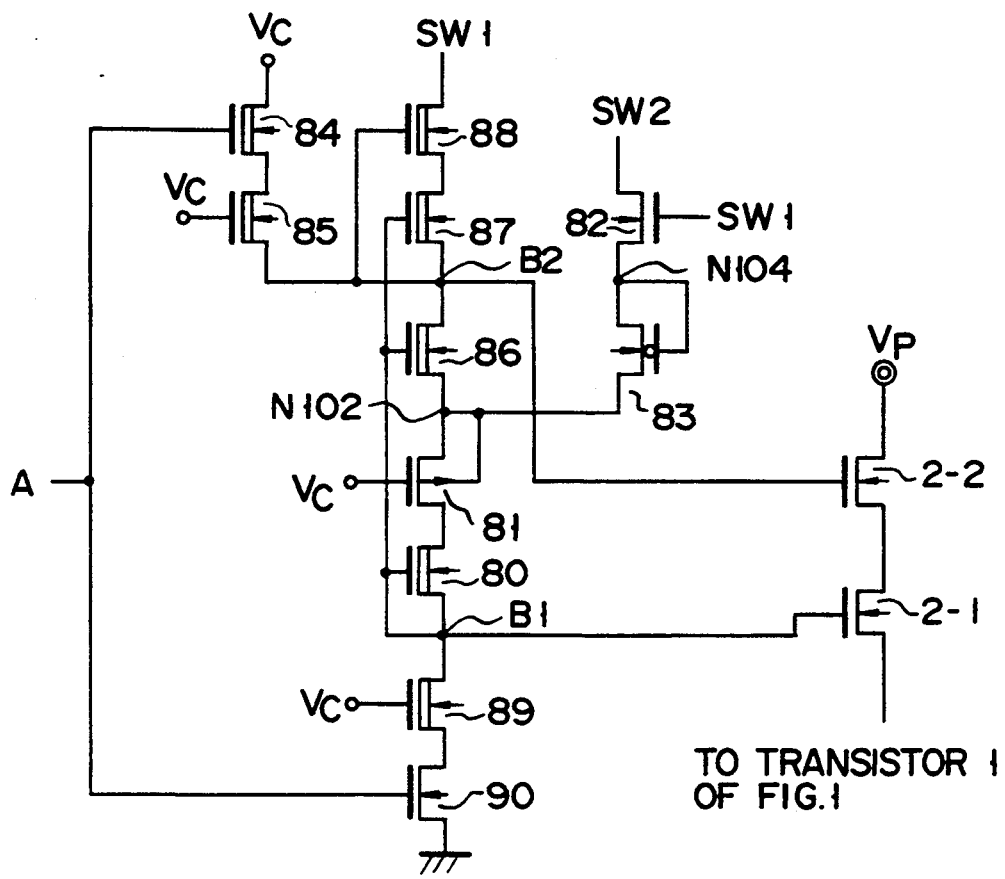
F I G. 19

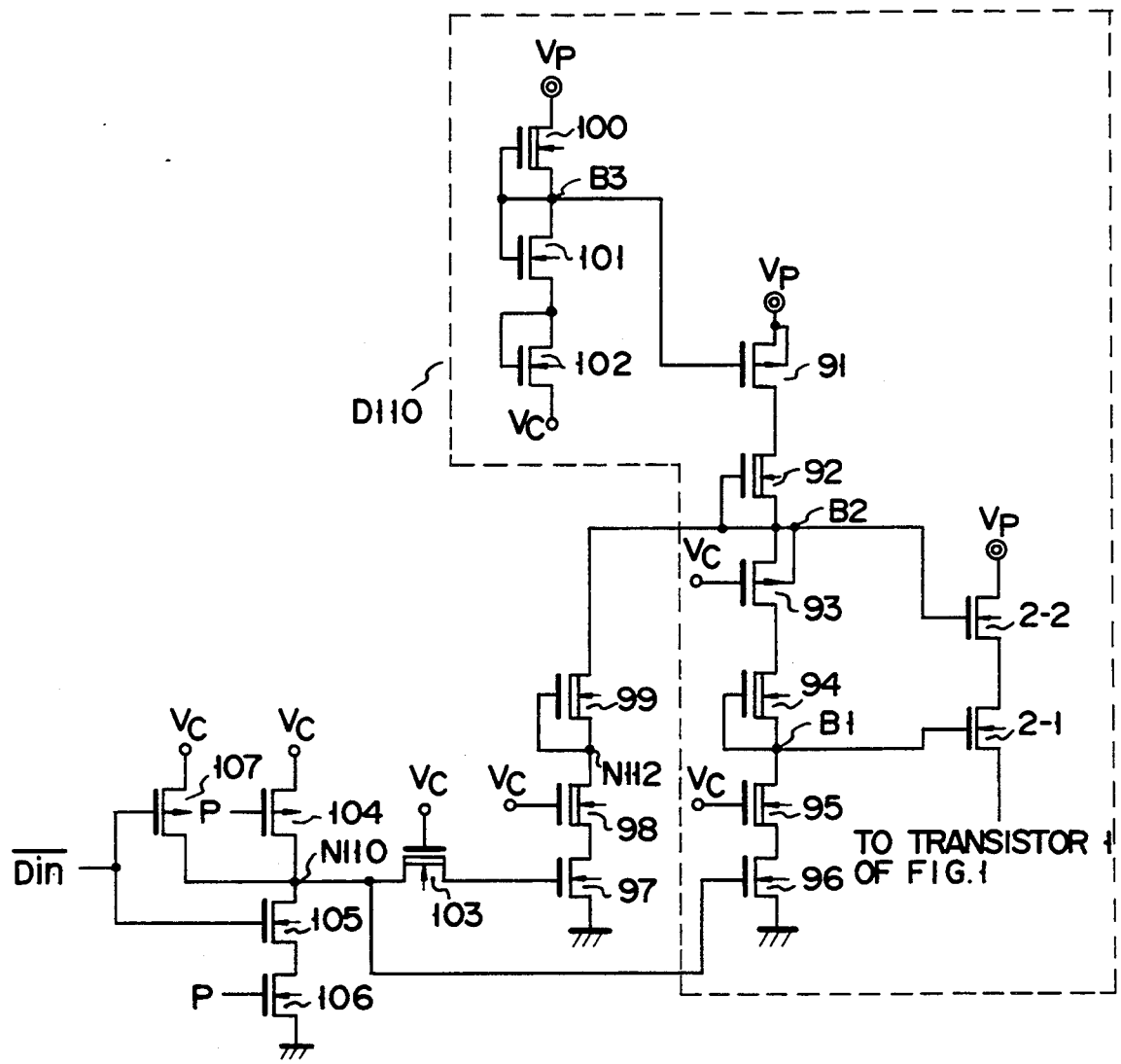
F I G. 20

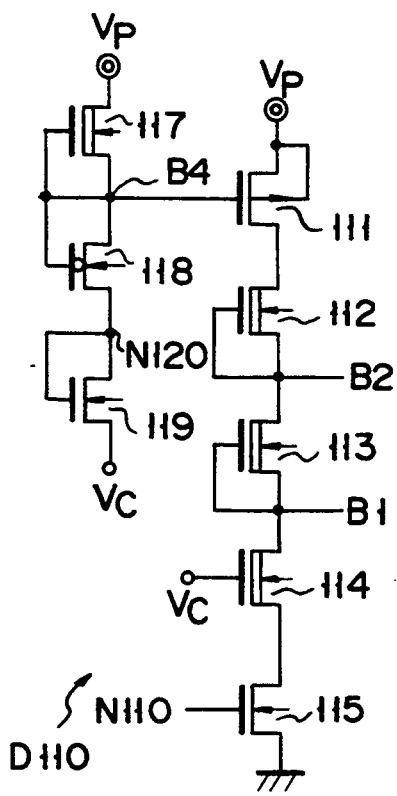
F I G. 21
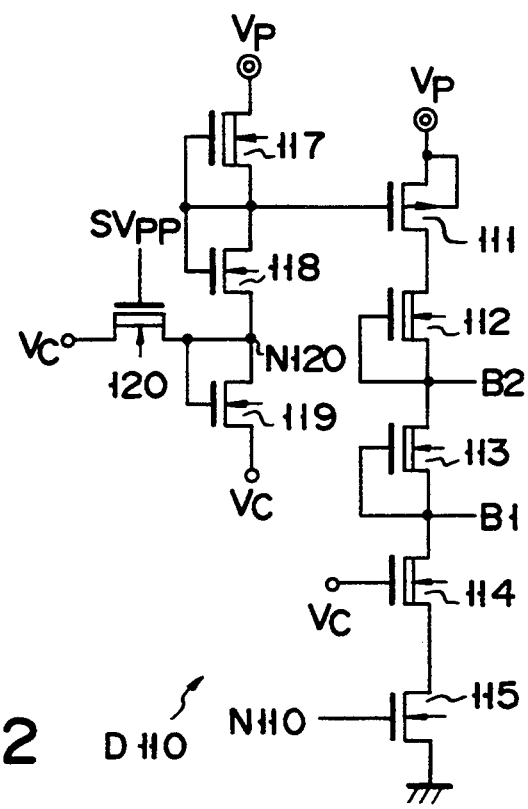
F I G. 22

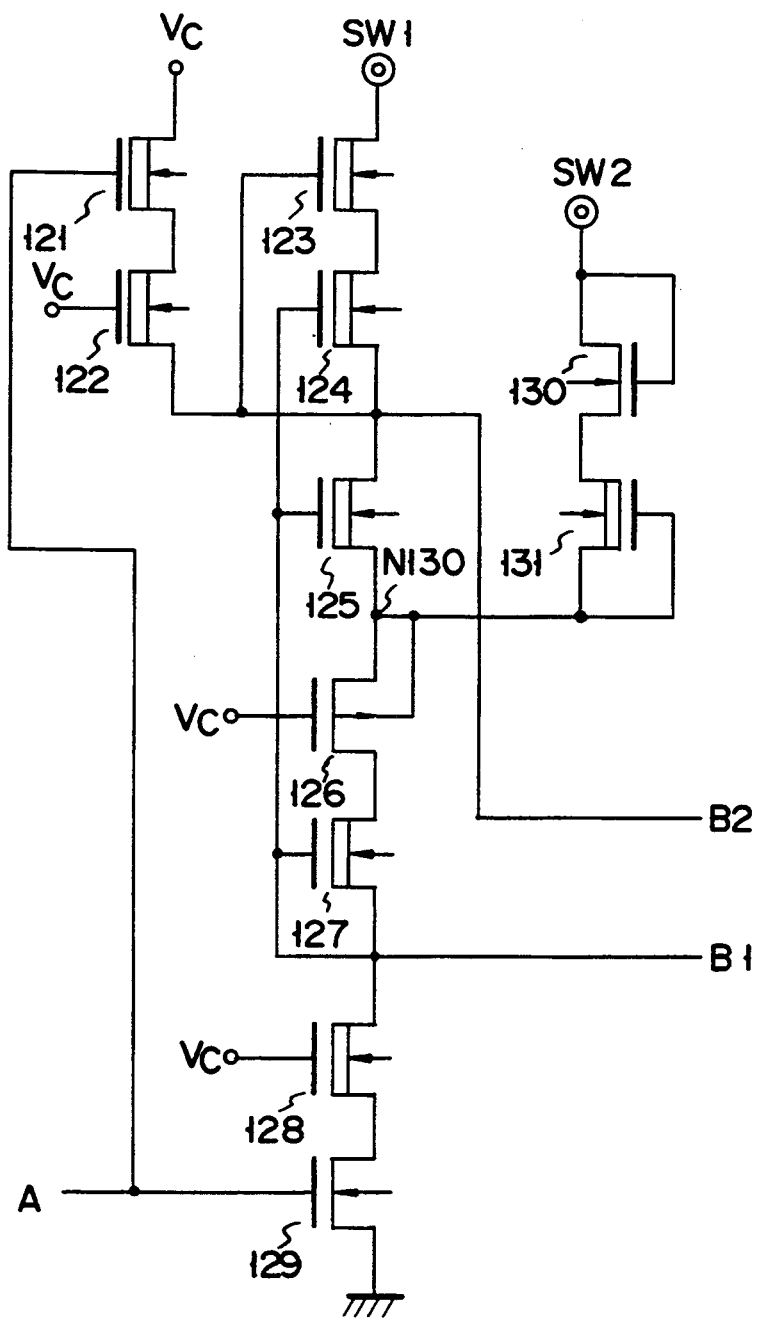
F I G. 23

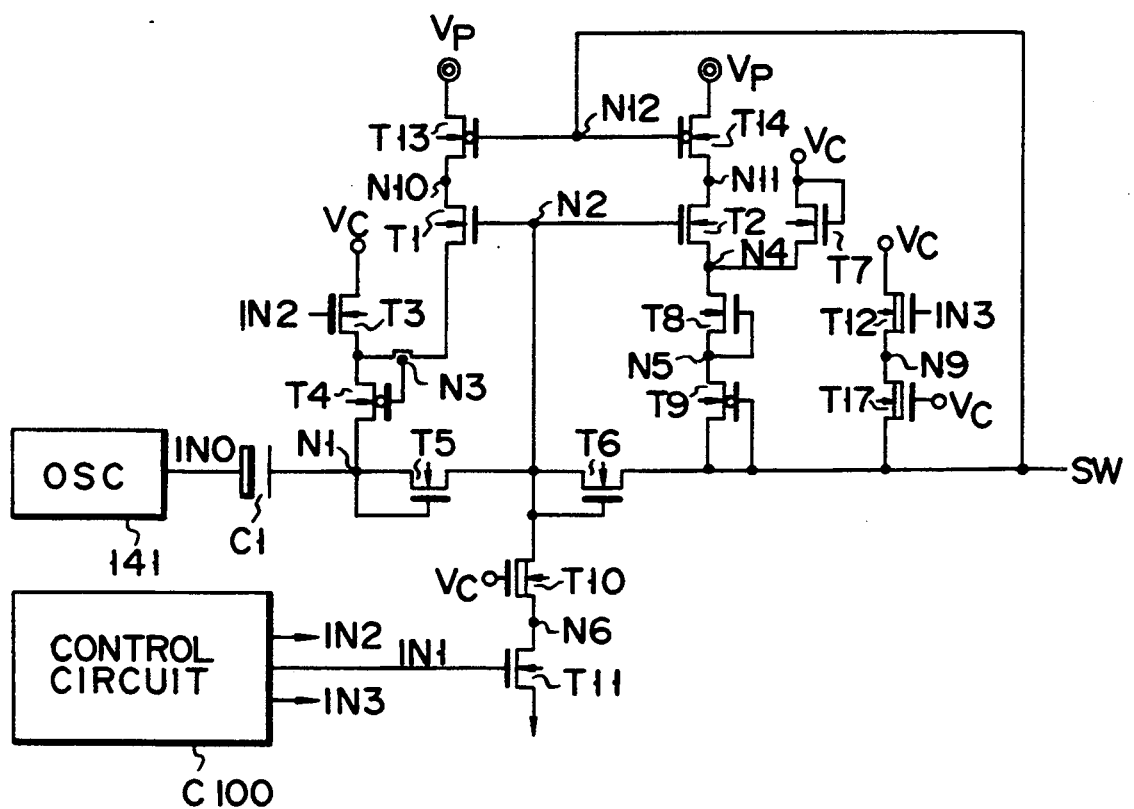
F I G. 24

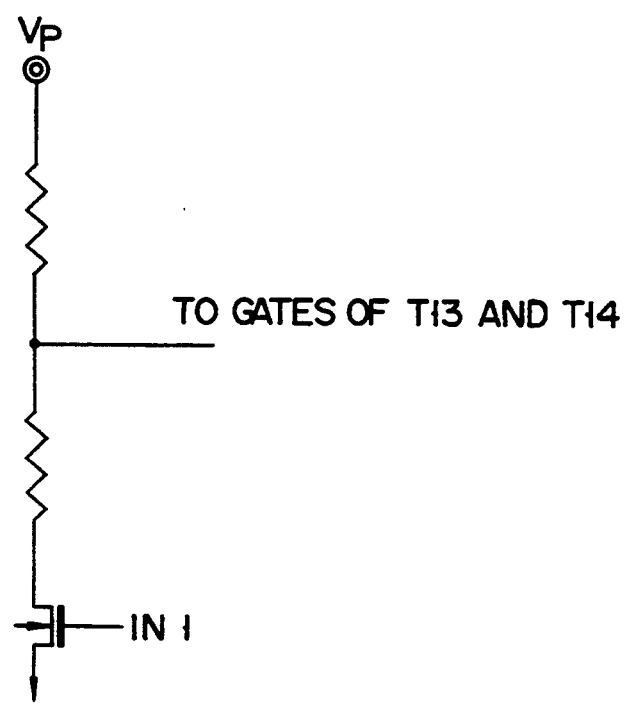
F I G. 28

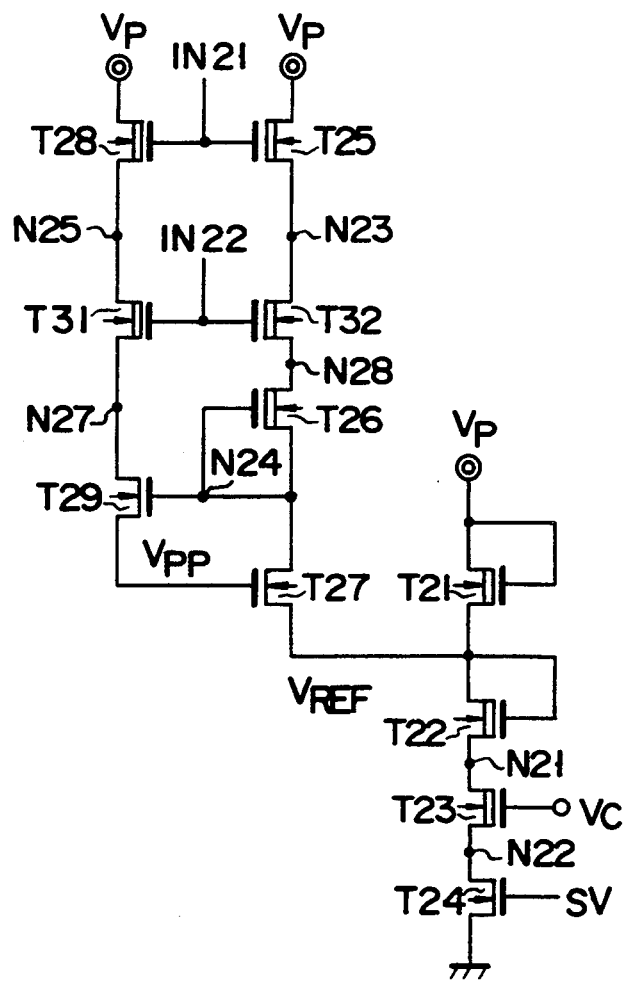
F I G. 30
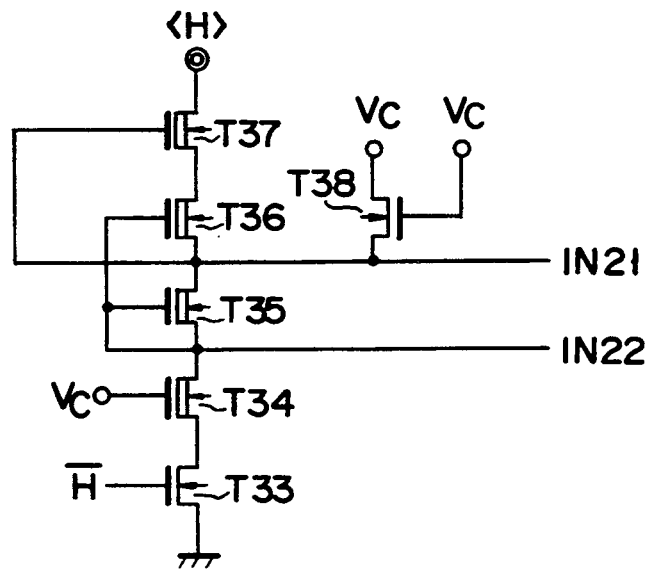
F I G. 31

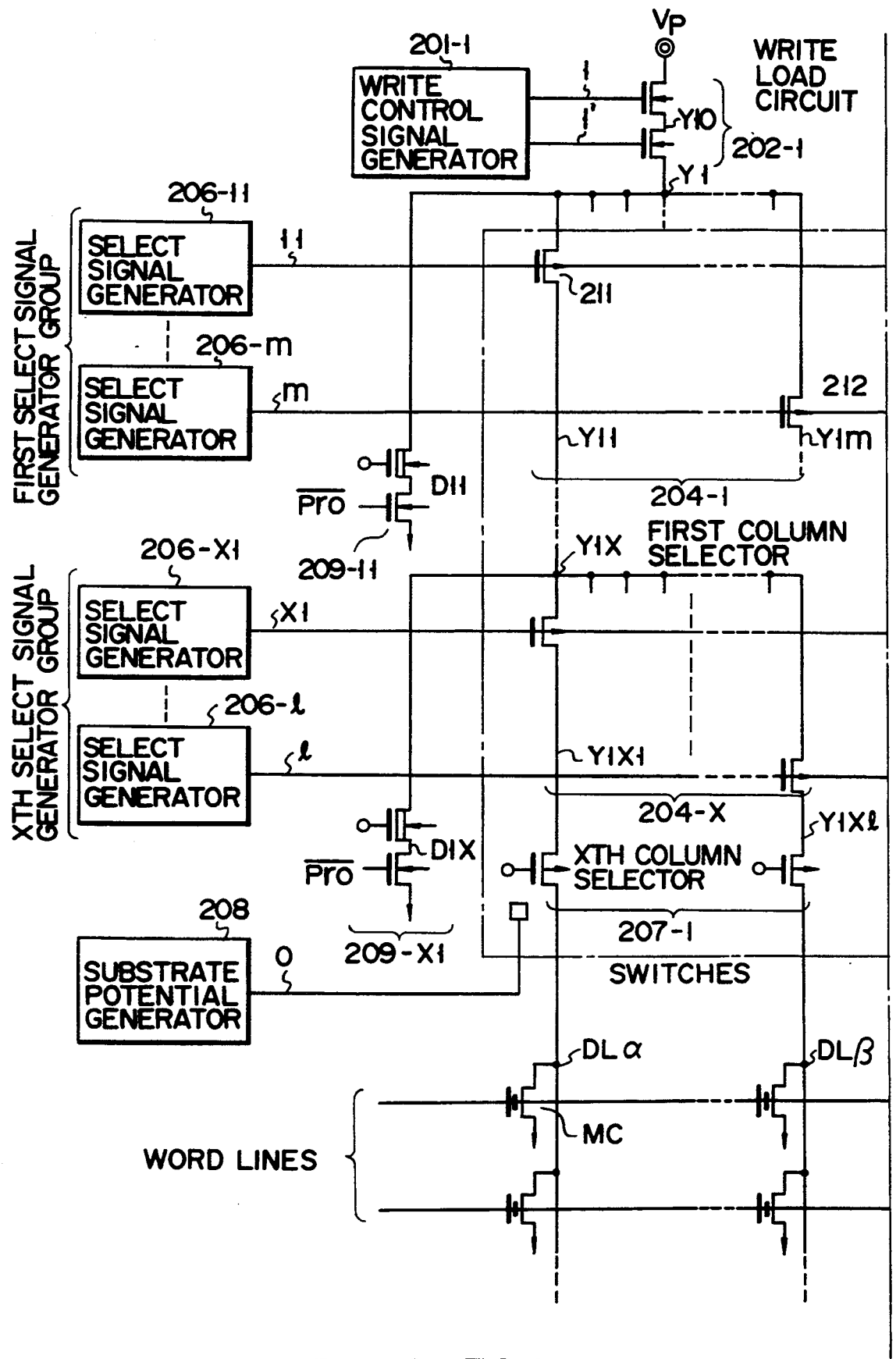
F I G. 32A

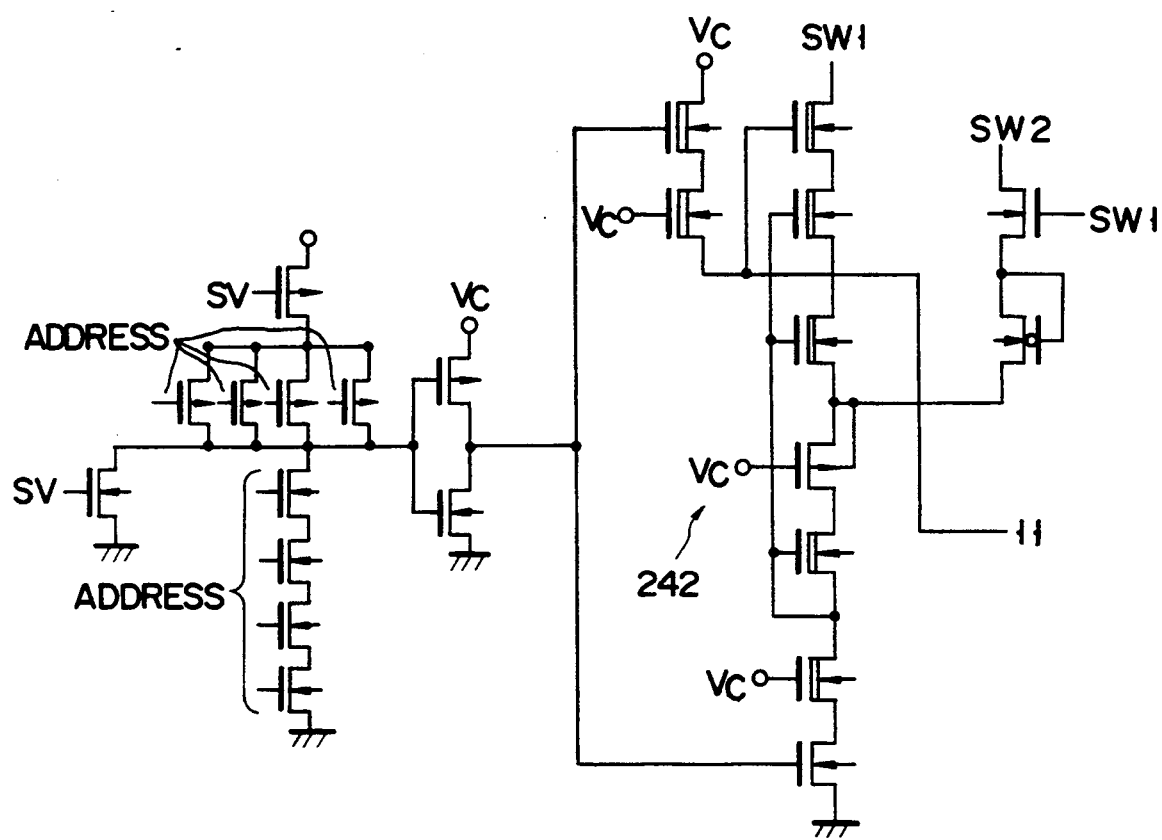
F I G. 33A

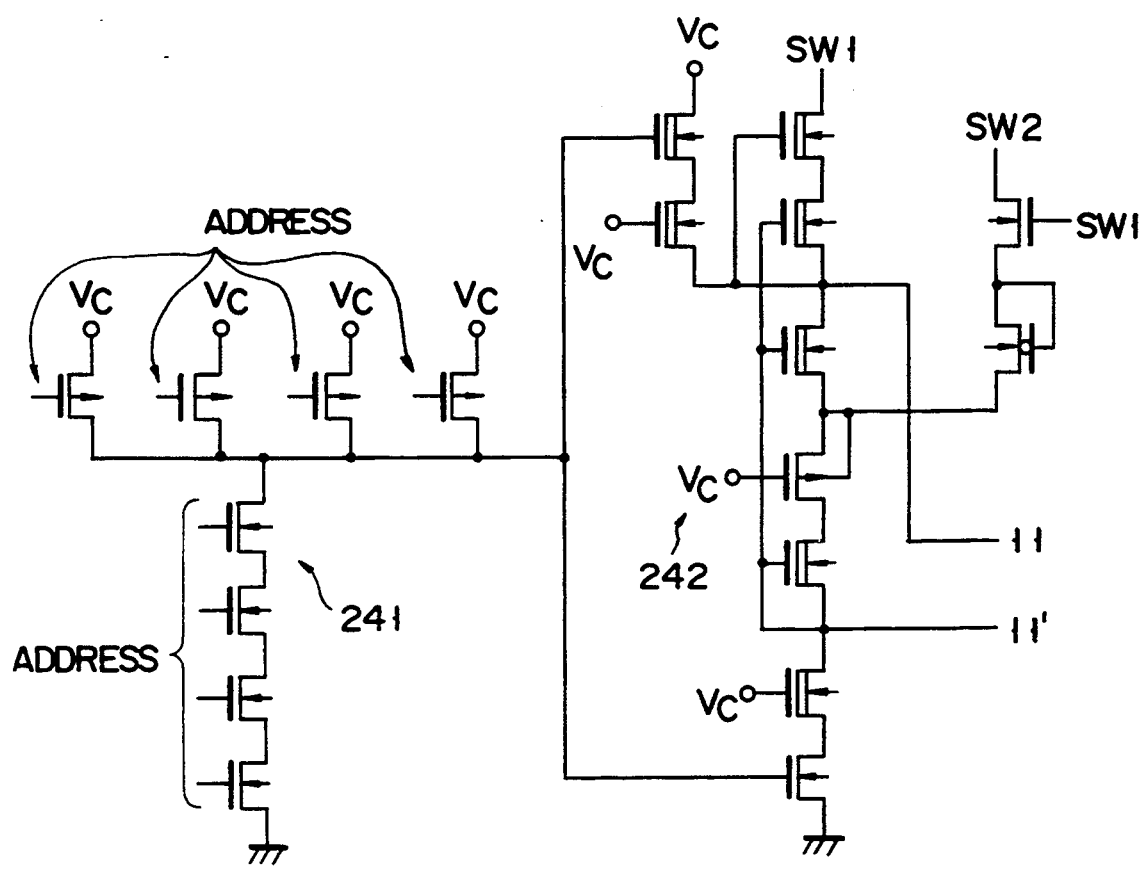
F I G. 33B

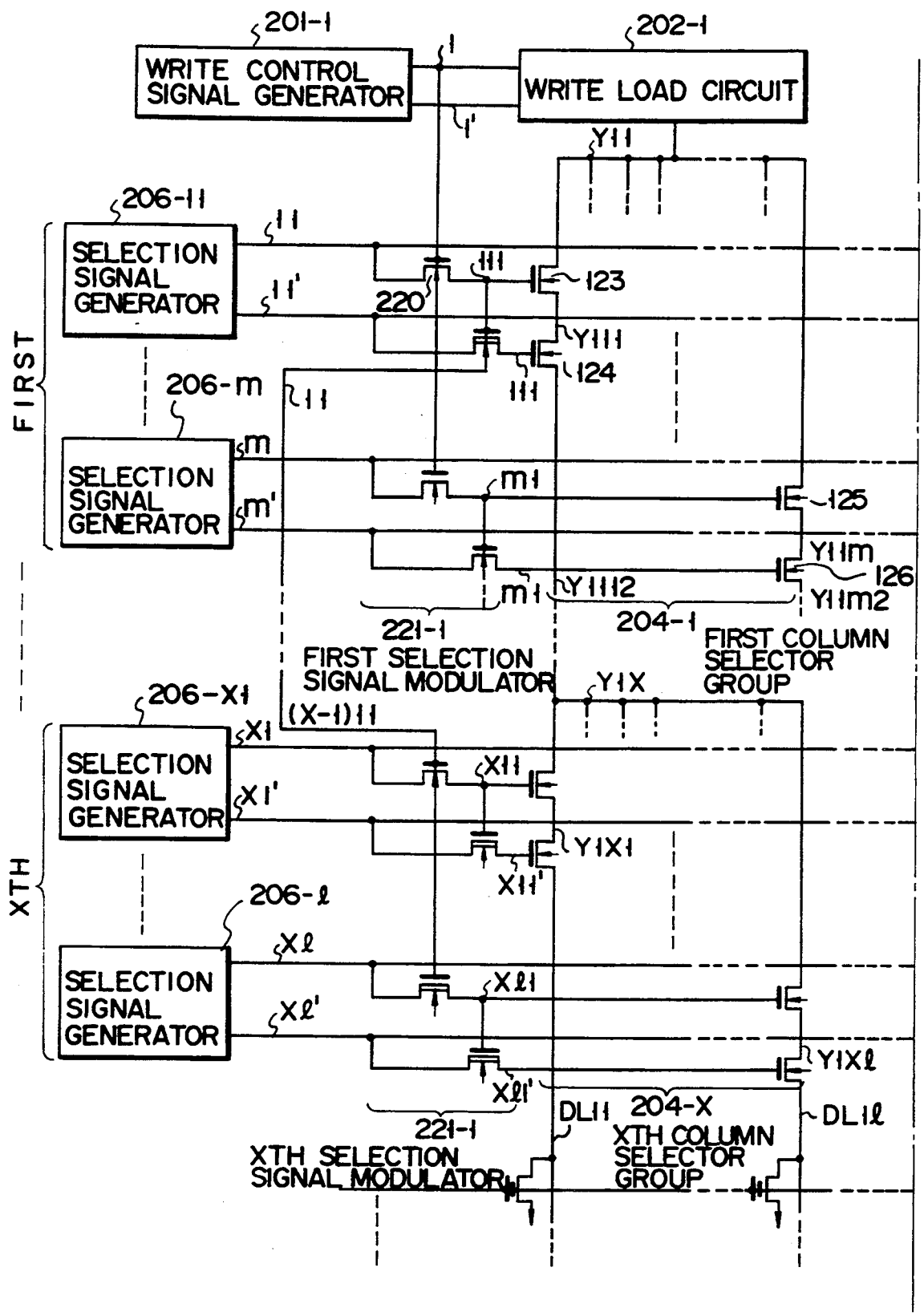
F I G. 36A

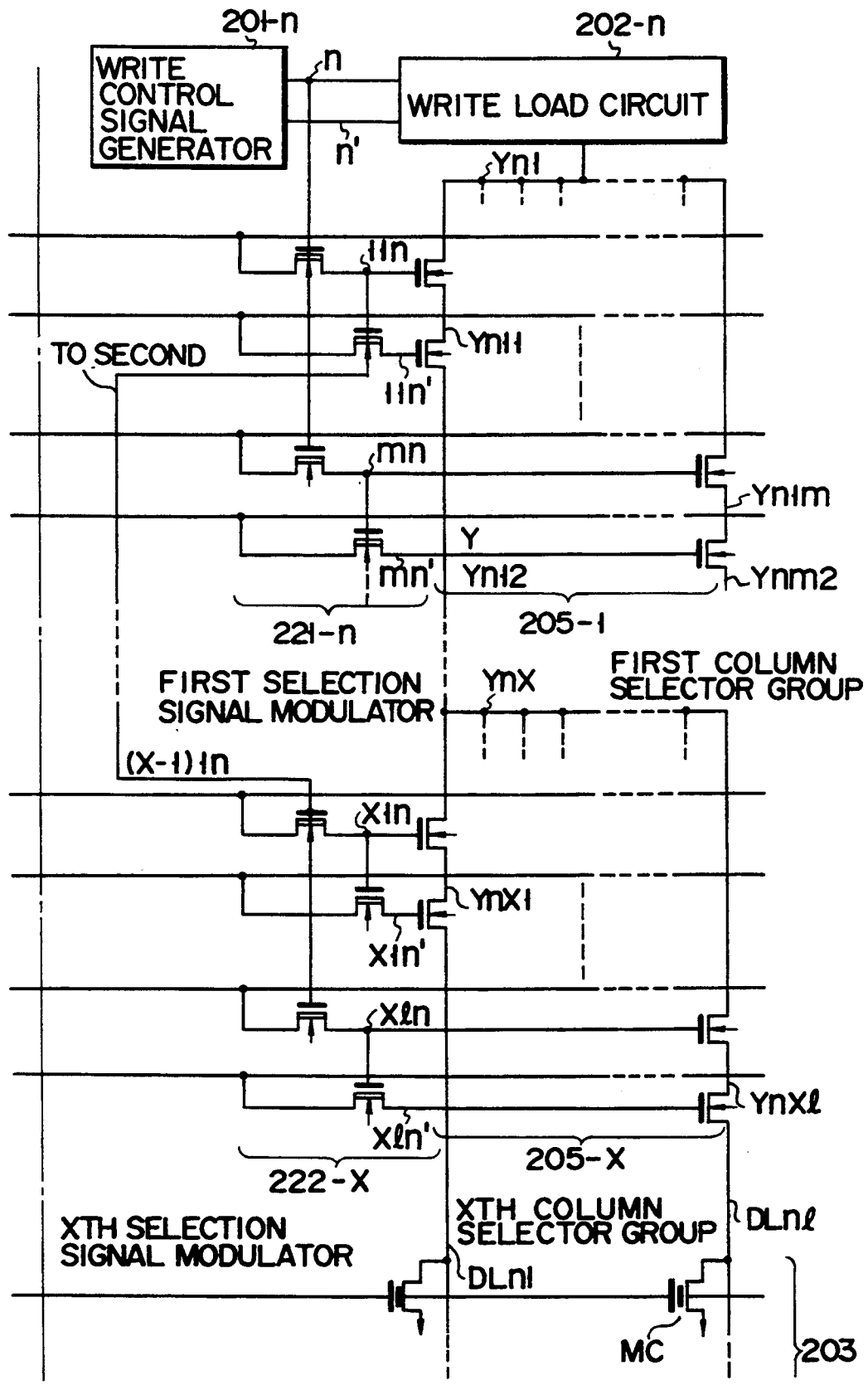
F I G. 36B

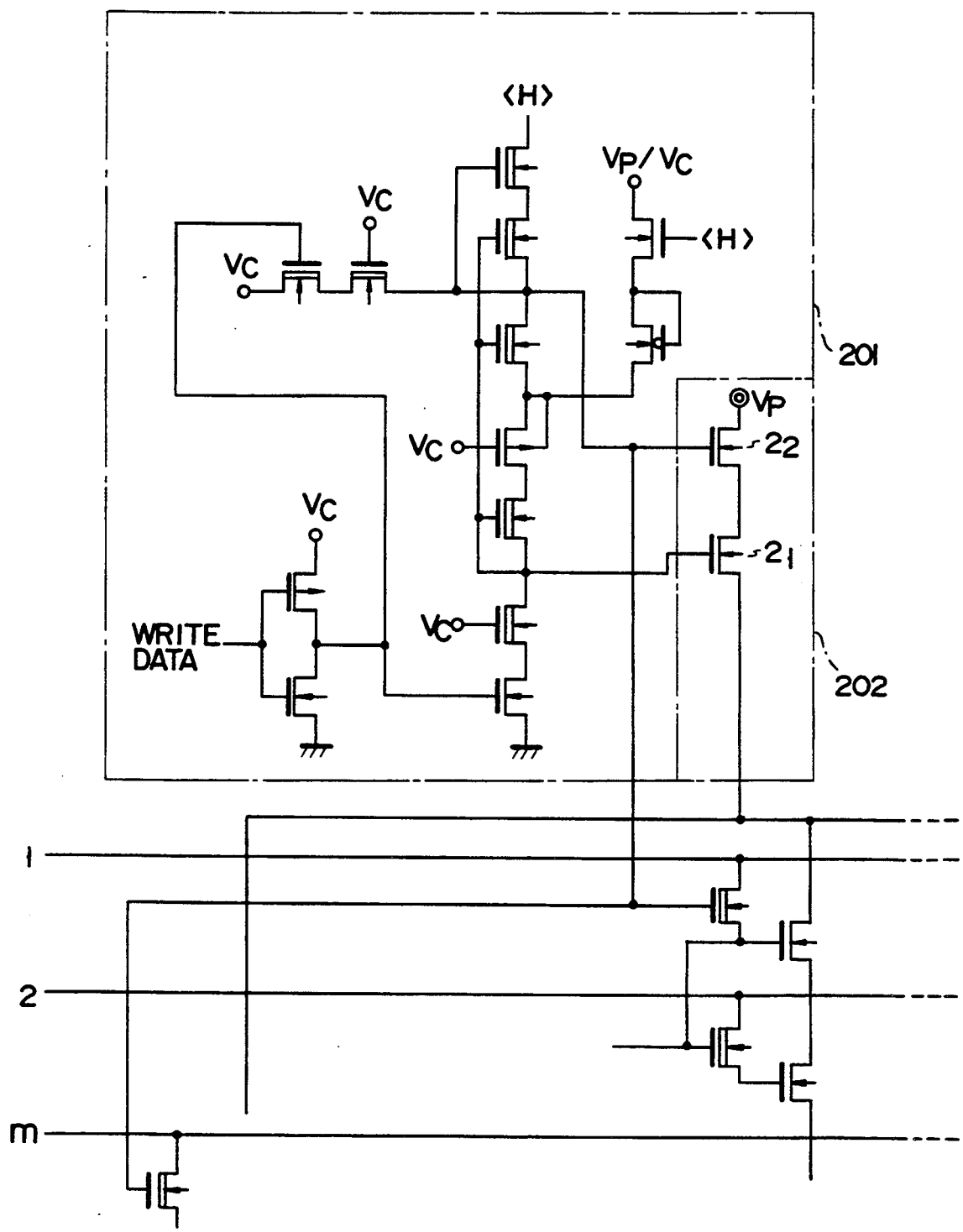
F I G. 37

SEMICONDUCTOR INTEGRATED CIRCUIT PROTECTED FROM ELEMENT BREAKDOWN BY REDUCING THE ELECTRIC FIELD BETWEEN THE GATE AND DRAIN OR SOURCE OF A FIELD EFFECT TRANSISTOR

This application is a continuation of application Ser. No. 07/401,923, filed Sep. 1, 1989, now abandoned.

BACKGROUND OF THE INVENTION

1. Field of the Invention

The present invention relates to a semiconductor integrated circuit protected from element breakdown and, more particularly, to a semiconductor memory protected from element breakdown.

2. Discussion of the Related Art

MOS transistor cells have been increasingly micropatterned as technology has progressed, and as result semiconductor memories having a larger memory capacity have been developed. The channel length of transistors has become shorter and gate insulating films have become thinner. Therefore, when memory capacity is the same as that of the conventional memory, the chip size of the semiconductor memory is decreased by the microlithography technique, thus providing a lower-cost semiconductor memory.

The arrangement of a conventional nonvolatile semiconductor memory having a MOS transistor with a floating gate as a memory cell is shown in FIG. 1. In this semiconductor memory, whether logic "0" data or logic "1" data is stored is determined depending on whether electrons are injected into a floating gate of a memory cell MC. Data is programmed in this memory cell, when a signal P is a logic "0". A logic level which is the same as input data Din appears at a node A. At this time, a high voltage is applied to a gate X of a memory cell MC, and to a gate Y of a column select transistor 1. When the input data Din is a logic "0", a voltage SW, which is higher in a program mode, is applied to the gate of a write load transistor 2. As a result, the transistor 2 is turned on, and a program voltage Vp is applied to the drain of the memory cell MC. Therefore, electrons are injected into the floating gate of the memory cell MC, and data "0" is written.

On the other hand, when the input data Din is set at a logic "1", the voltage of the gate of the write load transistor 2 is set to be 0 V. As a result, the transistor 2 is turned off. Therefore, the voltage Vp is not applied to the drain of the memory cell MC, and the floating gate is kept in a neutral state.

A write apparatus called a ROM writer is used to write data in the nonvolatile semiconductor memory, i.e., an EPROM shown in FIG. 1.

FIG. 2 shows an arrangement of a conventional booster for generating a voltage SW when data is written (programmed) into the memory cell. As shown in FIG. 3C, the output voltage SW of the booster is equal to a voltage Vc (e.g., 5 V) in a read mode, and is higher than a voltage Vp in a program mode (period T2 in FIG. 3A-3G). The voltage SW is also supplied to circuits such as a decoder which requires a high voltage in the program mode.

When a signal IN1 shown B in FIG. 4B is a logic "1", a transistor T11, shown in FIG. 2, to the gate of which the signal IN1 is input is turned on. A voltage of a node N2, shown in FIG. 2, is 0 V because a discharging operation is performed by a transistor T10 and the turned-on transistor T11. A voltage Vp is supplied to the drain of the transistor T1.

As shown in FIG. 4A, in a program mode, the voltage Vp goes to a high-voltage level (e.g., 12.5 V). As shown in FIG. 4B, in the program mode, data is written in practice during a period T2 when a program mode control signal $\overline{PGM}$ is a logic "0". Even if the program power source voltage Vp is applied, data is not written during periods T1 and T3 when the signal $\overline{PGM}$ is a logic "1". The periods T1 and T3 are used to prevent a write error or to perform initialization. For example, the lengths of periods T1 and T3 are determined to give a sufficient time margin for the externally supplied write data Din to reach a data write circuit in the EPROM. During the periods T1 and T3, the voltage Vp is the high voltage. However, since the signal IN1 is a logic "1", the voltage SW is not boosted.

As shown in FIGS. 4C and 4D, in a program mode, the signal IN1 and a signal IN3 are switched to a logic "0" (0 V), and a signal IN2 is switched to a logic "1". When the signal IN2 goes to a logic "1", the transistor T3 is turned on. As shown in FIG. 3C, a voltage obtained by subtracting a threshold voltage (VTH3) of the transistor T3 from a voltage VIN2 of the signal IN2, i.e., a voltage of (VIN2−VTH3) appears at a node N3. The voltage at the node N3 is applied to the gate of a transistor T4, the gate and the drain of which are connected to the node N3, and the transistor T4 is turned on. As a result, as shown in FIG. 3A, a voltage obtained by subtracting a threshold voltage VTH4 of the transistor T4 from the voltage (VIN2−VTH3), i.e., a voltage (VIN2−VTH3−VTH4) appears at the node N1. The voltage (VIN2−VTH3−VTH4) is applied to the gate of a transistor T5, the gate and the drain of which are connected to the node N1, and the transistor T5 is turned on. As a result, as shown in FIG. 3B, a voltage obtained by subtracting a threshold voltage VTH5 of the transistor T5 from the voltage (VIN2−VTH3−VTH4), i.e., a voltage (VIN2−VTH3−VTH4−VTH5) appears at the node N2, and is applied to the gates of the transistors T1 and T2.

If the voltage VIN2 is set to be 5 V, the threshold voltage VTH3 is set to be 1.0 V, and the threshold voltages VTH4 and VTH5 are set to be 0 V (that is, transistors T4 and T5 are "natural" or intrinsic transistors as indicated by the "circle" on their respective gates) to increase a boosting efficiency, a voltage of 4 V appears at the node N2. For this reason, when a boosting operation is started, a potential difference between the gate and the drain of each of the transistors T1 and T2 is set to be (Vp−4) V, and the potential of the node N2 is increased along with the boosting operation. For this reason, the potential difference between the drain and the gate of each of the transistors T1 and T2 is further decreased. Finally, the potential of the gate becomes higher than the potential of the drain.

When data is programmed in the memory cell MC, the higher the voltage applied to the drain of the memory cell MC is, the shorter the program time becomes. For this reason, the voltage SW is set to be higher than the program voltage Vp by, e.g., a threshold voltage of the transistor T2 in order to compensate for a voltage drop of the threshold voltage in the write load transistor 2 shown in FIG. 1. In the conventional nonvolatile semiconductor memory shown in FIG. 1, when data is written in another memory cell MC, a high voltage is applied to the control gate (if in the same row) or the drain (if in the same column) of memory cell MC in which data has already been written, and electrons are injected into the floating gate. Therefore, the electrons previously injected and accumulated in the floating gate are often discharged due to the high voltage applied to the control gate or the drain. In such a case, an erase error of data which has been written undesirably occurs. The thinner the gate insulating film of the memory cell MC, the more often the erase error occurs. In order to prevent such a phenomenon, during a data write operation, the voltage applied to the control gate or the drain of the memory cell must be decreased in correspondence with the reduction of the thickness of the gate insulating film so as to be equal to the conventional intensity of the electric field.

As described above, however, the high voltage Vp for a write operation supplied from the writer is fixed. Therefore, when an EPROM, in which a micropatterned transistor is employed to reduce costs and decrease chip size, is developed and the program voltage Vp is set at a low value in order to prevent an erase error of the data, a new writer having a lower output voltage Vp as the program voltage must be developed. However, it is not practical to develop a new writer each time a new EPROM is developed.

In order to solve the above problem, there is proposed a highly reliable semiconductor integrated circuit in Japanese Patent Publication (Kokai) No. 58-115411. In this semiconductor integrated circuit, even if elements are micropatterned under the condition that an externally supplied power source voltage is fixed, an erase error of data does not occur. In this proposal, there is provided a semiconductor integrated circuit wherein a gate voltage of a voltage conversion MOSFET is controlled in correspondence with a reference voltage, so that a constant internal power source voltage lower than the external power source voltage can be obtained from one terminal of the voltage conversion MOSFET.

FIG. 5 is a circuit diagram showing an arrangement of a nonvolatile memory disclosed in this proposal. Referring to FIG. 5, an EPROM circuit 41 has all the functions of a memory, and includes the memory cell MOSFETs (shown in FIG. 1) including the column select MOSFET 1, the data write MOSFET 2, and row and column decoders. The EPROM circuit 41 includes an external power source terminal 42 to which the power source voltage Vc (e.g., 5 V) is supplied, an external power source terminal 43 to which a voltage Vp is supplied in a data write mode, and an internal power source terminal 44 to which a constant voltage Vpp lower than the voltage Vp is supplied, the voltage Vpp being supplied to a memory cell MOSFET in the EPROM circuit 41 in the data write mode.

A MOSFET 51 is inserted between the external and internal power source terminals 43 and 44 to convert the voltage Vp supplied to the terminal 43 into the voltage Vpp lower than the voltage Vp. In addition, a reference voltage generator 54, including series-connected resistors 52 and 53, is inserted between the external terminal 43 and a ground potential Vss. In the reference voltage generator 54, a reference voltage VREF obtained by dividing the voltage Vp in accordance with the ratio of resistances of the resistors 52 and 53 is output from a connection node 55 between the resistors 52 and 53. In addition, a controller 58 in which a depletion type MOSFET 56 and an enhancement type MOSFET 57 is series-connected is inserted between the external power source terminal 43 and the node 55. The source of the FET 56 and the drain of the FET 57 are connected. In the controller 58, the gate of the MOSFET 56 and the gate of the voltage conversion MOSFET 51 are connected to a connection node 59 between the MOSFETs 56 and 57, and the gate of the MOSFET 57 is connected to the internal power source terminal 44, i.e., the source of the voltage conversion MOSFET 51. More specifically, the controller 58 serves as an inverting amplifier having the depletion type MOSFET 56 serving as a load transistor, and the enhancement type MOSFET 57 serving as a drive transistor. As a result, a voltage corresponding to a difference between the voltage Vpp at the internal power source terminal 44 and the reference voltage VREF appears at the node 59.

With such an arrangement, when the voltage Vpp at the internal power source terminal 44 is changed from a stable voltage to a lower voltage than the stable voltage, the conduction state of the MOSFET 57 in the controller 58 gets an OFF state, and the resistance between the source and the drain of the MOSFET 57 is increased. When the resistance is increased, the voltage of the node 59 is increased accordingly. Therefore, the conduction state of the MOSFET 51 gets near a stronger ON state, and the voltage Vpp at the terminal 44 returns to the original value. On the other hand, when the voltage Vpp at the internal power source terminal 44 is changed from a stable voltage to a higher voltage than the stable voltage, the MOSFET 51 gets near a stronger ON state, and the resistance between the source and the drain of the MOSFET 57 is decreased. Therefore, the voltage of the node 59 is decreased, the MOSFET 51 gets almost to an OFF state, and, hence, the voltage Vpp returns to the original value. In other words, the gate of the MOSFET 51 is controlled by the controller 58, so that the voltage Vpp of the internal power source terminal 44 is always kept at a constant value.

The voltage Vpp at the internal power source terminal 44 and an output voltage Vo from the controller 58 are defined as follows:

$$Vpp = VREF + VTH2 \tag{1}$$

$$Vpp = Vo - VTH1 \tag{2}$$

where VTH1 is the threshold voltage of the MOSFET 51, VTH2 is a threshold voltage of the MOSFET 57, and Vo is a voltage at the node 59 of the controller 58, i.e., an output voltage of the controller 58.

As is apparent from equation (1), the voltage Vpp is controlled to be equal to a sum of the voltages VREF and VTH2. Note that the resistance ratio of the resistors 52 and 53 in the reference voltage controller 54 is controlled, so that the reference voltage VREF can be arbitrarily set to be a voltage lower than the voltage Vp supplied to the terminal 43. For this reason, the voltage Vpp at the internal power source terminal 44 can always be a substantially constant voltage lower than the voltage Vp. For example, the voltage Vpp obtained at the internal power source terminal 44 is supplied to the control gate of the memory cell MOSFET (FIG. 1) in the EPROM circuit 41. For this reason, even if the memory cell MOSFET is micropatterned compared to the conventional one, and the thickness of the gate insulating film thereof is thinner, the voltage Vpp, lower than the voltage Vp supplied to the external power source terminal 43, is applied to the memory cell's control gate. Therefore, even if the write output voltage Vp of the writer for supplying the voltage Vp to the terminal 43 is fixed, no erase error of data as in the conventional case occurs. Therefore, the value of the write output voltage Vp in the writer need not be changed for each memory, and the conventional writer can be commonly used.

More specifically, even if the memory cell MOSFET is micropatterned under the condition that the externally supplied data write power source voltage Vp is fixed, an erase error of data does not occur, and a reliable operation is achieved.

FIG. 6 shows an arrangement of a nonvolatile memory according to a modification of the circuit shown in FIG. 5. The arrangement in FIG. 6 is different from that in FIG. 5 as follows. In FIG. 6, a MOSFET 60 is inserted between a MOSFET 51 and a terminal 43, and a MOSFET 61 is inserted between a resistor 53 and a ground potential Vss. A signal H, higher than the voltage Vp, is supplied to the gate of the MOSFET 60 in a program mode. A signal SV which is set at a logic "1" in the program mode to cause the transistor 61 to turn on is supplied to the gate of the MOSFET 61.

In this circuit, both the MOSFETs 60 and 61 are turned OFF in any mode except for the program mode. Therefore, a current is not supplied to the MOSFET 51, a reference voltage generator 54, and a controller 58, and current consumption can be decreased.

In the program mode, a high voltage Vp is applied to the terminal 43. When an externally input control signal is set at a predetermined logic level while the high voltage Vp is applied to the terminal 43, a data write operation is performed. For this reason, a circuit for detecting that the voltage Vp becomes a high voltage is arranged in the integrated circuit. The integrated circuit also has a verification function to check whether correct data is written. The verifying operation is performed while the high voltage Vp is kept applied to simplify an ON/OFF operation of the externally supplied power source voltage.

FIGS. 7A to 7F are timing charts, in a program mode, of the conventional 256 k-bit EPROM and in a program verify mode. When an externally applied chip enable signal $\overline{CE}$ is set at "0" level as shown in FIG. 7B, and an output enable signal $\overline{OE}$ is set at "1" level as shown in FIG. 7C, a program operation is performed, i.e., data is written. When the signal $\overline{CE}$ is "1" and the signal $\overline{OE}$ is "0", a verify mode is obtained. At this time, in the integrated circuit, the signals SV and H shown in FIG. 6 are as follows. When the high voltage vp is applied to the terminal 43, this application is sensed, and the signal SV goes to "1" level, and the MOSFET 61 in FIG. 6 is turned on. On the other hand, when the signal $\overline{CE}$ is logic "0" and the signal $\overline{OE}$ is logic "1" in a program mode, the signal H is set at a high voltage. As a result, as described above, a voltage Vpp lower than the external power source voltage Vp by a predetermined voltage is supplied to the EPROM circuit only in the program mode. For this reason, a mode wherein the high voltage Vp is applied to the terminal 43 while the signal H is kept at 0 V and the MOSFET 60 is kept OFF is present.

Referring to FIGS. 8A and 8B, the EPROM will be described in detail. Each of write control signal generators 71-1 to 71-n outputs a write control signal having different output states in accordance with logical states of write data. Each of write load circuits 72-1 to 72-n determines in response to the write control signal whether or not a write voltage to write the data in a nonvolatile memory cell is to be output. Column selectors 74-11 to 74-x1, . . ., 74-1n to 74-xn constituting the first to the xth stages select corresponding data lines DL-11 to DL-n1 of a nonvolatile memory cell array 73. Select signal generators 75-11 to 75-1m, . . ., 75-x1 to 75-xl constituting the first to the xth stages control the corresponding column selectors. For example, when a memory cell 77-xl is selected, transistors 76-11 and 76-xl are selected.

As described above, the thickness of a gate insulating film is further decreased along with micropatterning of a semiconductor integrated circuit, and the depths of diffusion layers in diffusion regions of the drain and the source are also decreased. As a result, the breakdown voltage at the drain region of the transistor is decreased. For this reason, when a nonvolatile semiconductor memory is manufactured using a further micropatterned transistor, the transistor must be used in a voltage region wherein the drain breakdown does not occur.

In general, an electric field for causing the breakdown at the drain of a MOSFET is weaker than that for causing breakdown at a p-n junction. The lower the gate voltage is, the lower the drain breakdown voltage becomes. For example, when the potential of a gate B is 0 V, the drain breakdown voltage of the write load transistor 2 shown in FIG. 1 is a minimum value. If the breakdown occurs in the transistor to which the voltage Vp is supplied from the external power source, a sufficient current is supplied from the external power source, so that the breakdown does not stop, thus destroying the transistor. For example, the breakdown does not occur at a voltage which is normally used. However, if noise is added to the voltage Vp and the voltage Vp exceeds the breakdown voltage, the breakdown occurs. At this time, if decisive breakdown occurs, negative-resistance characteristics are exhibited, and the breakdown does not stop. As a result, the transistor may often be broken.

In the circuit shown in FIG. 2, the potential of the node N2 is 0 V during the periods T1 and T3 and is not 0V for the period T2 when data is written in practice. Therefore, a potential difference between the drain and the gate of each of the transistors T1 and T2 is equal to the voltage Vp, and the strongest electric field is obtained. For this reason, when the thickness of the gate insulating film is decreased because of micropatterning of elements, the possibility that the gate insulating film will be damaged is increased during the periods T1 and T3 when the electric field is the strongest. If a countermeasure against this problem is not taken, micropatterning of elements cannot be achieved. In the future, the thickness of the gate insulating film will be decreased as micropatterning is advanced, and elements will further tend to be damaged in the above circuit arrangement.

In FIG. 6, the number of transistors having a gate insulating film to which a strong electric field is applied is small compared to the conventional case, and the probability of the gate insulating film being damaged is decreased. However, the electric field between the drain and the gate in the MOSFET 60 is strong, and the gate insulating film between the drain and the gate may be damaged. The MOSFET 61 also has the same probability for being damaged. More specifically, in the transistor 61, a voltage set at 0 V of the signal SV is applied to the gate, and a high voltage is applied to the drain, after a high voltage is applied as the voltage Vp until the high voltage is sensed and the signal SV is set at "1" level. Meanwhile, the electric field between the drain and the gate of the MOSFET 61 has a high intensity, and the possibility for damaging the gate insulating film is increased.

In the circuit shown in FIGS. 8A and 8B, when the transistor 76-11, in the first column selector, 74-11 is selected, an output from the write load circuit 72-1 is equal to the voltage Vp. However, since outputs from the select signal generators 75-12 to 75-1m are set to be 0 V, the intensity of the electric field between the gate and the drain of each of the transistors 76-12 to 76-1m is increased, and the possibility of damaging the gate insulating film is increased. In addition, when the transistor 76-11 is selected and a high voltage is applied to its gate, a high voltage is not often output from the write load circuit depending on write data. At this time, the intensity of the electric field between the gate and the channel of the transistor 76-11 is maximum, and damage to the gate insulating film may occur.

As described above, when the thickness of the gate insulating film of the MOSFET is decreased, the electric field applied to the gate insulating film is so strong that not only the MOSFET but also its peripheral transistors may often be damaged. In addition, the problems caused by micropatterning of elements are posed in not only the nonvolatile memory, but also in other memories. Thus, in the conventional circuit, the problems such as an erase error of data or breakdown of elements are posed because of micropatterning of the elements, thus degrading reliability.

SUMMARY OF THE INVENTION

The present invention has been made in consideration of the above situations, and has as its object to increase the breakdown voltage at a drain of a transistor.

It is another object of the present invention to provide a highly reliable semiconductor integrated circuit in which elements, such as gate insulating films, are not damaged even if semiconductor elements are micropatterned under the conditions that a conventional externally supplied power source voltage is used.

In order to achieve the above objects according to the present invention, there is provided with a semiconductor integrated circuit for supplying a program potential to a memory cell, includes a first supply potential terminal provided for supplying a first potential as a program potential in a program mode, first and second MOS transistors connected in series between the memory cell and the first supply potential terminal, for supplying the first potential to the memory cell to write data into the memory cell, a booster connected to the first supply potential terminal, for boosting the first potential to a second potential, and a controller for applying the second potential to gates of the first and second MOS transistors when the data is set at a first logic value, and applying a third potential to the gate of the first MOS transistor and a fourth potential to the gate of second MOS transistor gate when the data is set at a second logic value, the fourth potential being lower than the first potential and higher than the third potential, the third potential corresponding to a ground potential.

The controller in the semiconductor integrated circuit according to the present invention further includes a section cutting off a current path between the booster and ground.

In order to achieve the above object, the semiconductor integrated circuit for supplying a program potential to a memory cell includes a first supply potential terminal provided for supplying a first potential as a program potential in a program mode, first and second MOS transistors connected in series between the memory cell and the first supply potential terminal, for supplying the first potential to the memory cell to write data into the memory cell, and a controller for applying the first potential to gates of the first and second MOS transistors when the data is set at a first logic value, and applying a second potential to the gate of the first MOS transistor and a third potential to the gate of the second MOS transistor when the data is set at a second logic value, the third potential being lower than the first potential and higher than the second potential the second potential corresponding to a ground potential.

In order to achieve the above object, the semiconductor integrated circuit having a booster protected from breakdown of a gate insulating film of a MOSFET, includes a capacitor, one terminal of which is connected to a first node, an oscillator connected to the other terminal of the capacitor, for biasing the capacitor by a given potential at a given frequency, a first supply potential terminal provided for supplying a first potential in a program mode, a charger including a first transistor having a first gate, a first source, and a first drain, and connected to the first node and the supply potential terminal, for charging the capacitor toward the first potential to output a boosted potential, the first drain being connected to the first supply potential terminal, and a controller for supplying the boosted potential from the charger to the first gate of the first transistor in the program mode and supplying a potential lower than the first potential and higher than a ground potential to the first gate of the first transistor in any mode except for the program mode.

In order to achieve the above object, the semiconductor integrated circuit for converting a potential without element breakdown, includes a first supply potential terminal, a second supply potential terminal provided for supplying a second supply potential lower than the first supply potential, a reference potential generator for generating a reference potential, a first transistor, connected between the first and second supply potential supply terminals and having a gate, for converting the first potential into a second potential, a controller for generating a potential determined in accordance with a difference between the second potential and the reference potential from the reference potential generator, and supplying the determined potential to the gate of the first transistor, a second transistor connected between the first transistor and the first supply potential terminal and having a gate, and a gate potential applying section for selectively applying one of a third potential higher than a ground potential and a fourth potential higher than the second potential to the gate of the second transistor.

In order to achieve the above object, the semiconductor integrated circuit for programing data into a selected memory cell without breakdown of an element, includes nonvolatile memory cells connected to a plurality of data lines, a control signal generator for generating a control signal determined in accordance with the data to be written, a column selector comprising a plurality of p-channel type transistors, for selecting the data line to which the selected memory cell is connected, a program potential supply terminal, a write load section for generating a write potential from the program potential in response to the control signal from the control signal generator, and for supplying the write potential to the selected data line via the column selector, and a select signal generator for supplying first and second potentials to the column selector to control the column selector, the first potential being lower than the write potential and being supplied to p-channel transistors of the column selector which are connected to the selected data line and the second potential being higher than the write potential and being supplied to p-channel transistors of the column selector which are not connected to the selected data line.

In order to achieve the above object, the semiconductor integrated circuit for programming data into a selected memory cell without breakdown of an element, includes nonvolatile memory cells connected to a plurality of data lines, a control signal generator for generating a control signal determined in accordance with the data to be written, a write load section for generating a write potential for writing the data in the selected memory cell in response to the control signal from the control signal generator, a column selector including first and second transistors of an n-channel type connected in series between the write load section and each of the plurality of data lines for selecting a data line to which the selected memory cell is connected, and a selection controller for controlling the column selector such that the first and second transistors operate as protecting and switching elements, respectively, the selection controller supplying a first potential to a gate of each of the second transistors connected to not selected data lines to turn off the second transistors and a second potential to a gate of each of the first transistors connected to the not selected data lines, and the second potential being higher than the first potential.

In order to achieve the above object, the semiconductor integrated circuit without breakdown of an element, includes a first supply potential terminal, first and second transistors connected in series between the first supply potential terminal and an output node, and respectively having first and second gates, and a controller for receiving data to supply the first potential to the first and second gates of the first and second transistors when the data is a first logic value, and to supply a ground potential to the second gate of the second transistor, and a second potential to the first gate of the first transistor when the data is a second logic value, the second potential being lower than the first potential from the power source potential supply terminal and higher than the ground potential.

In order to achieve the above object, the semiconductor integrated circuit without breakdown of an element, includes a transistor circuit including at least one transistor, a supply potential terminal, having a drain, a source and a gate and a transistor operatively coupled to the transistor circuit, for supplying a first supply potential to the transistor circuit, and a controller connected to the first supply potential terminal, for selectively supplying one of the first potential and a second supply potential to the gate of the transistor in response to an input signal in a first mode to prevent drain breakdown of the transistor, the second potential being lower than the first potential and higher than a ground potential.

More specifically, according to the present invention, as described above, the first and second load transistors are arranged between the memory cell and the program potential supply terminal. When the voltage of the gate of the first load transistor is set to be 0 V, a voltage higher than 0 V and lower than a program potential is applied to the gate of the second transistor, and the program potential is not directly applied to the drain of the first transistor, the gate potential of which is set to be 0 V. In addition, since the gate potential of the second transistor is high, a breakdown voltage is increased. Thus, the breakdown voltage is increased. As represented in other features, the gate voltage of the MOS transistor is increased as compared with the conventional case, and the voltage across the gate and the drain is decreased. Therefore, the intensity of an electric field applied to the gate insulating film is decreased, and breakdown of the gate insulating film is prevented. Therefore, according to the present invention, a breakdown voltage at the drain of the write load transistor is increased. Even if the integrated circuit is micropatterned, it is difficult to break the gate insulating film, thus improving the reliability.

BRIEF DESCRIPTION OF THE DRAWINGS

FIG. 6 shows a modification of a part of the circuit of the nonvolatile memory shown in FIG. 5;

FIGS. 7A–7F shows timing charts of a conventional EPROM in program or program verify mode;

FIG. 9 shows an arrangement of a semiconductor integrated circuit according to a first embodiment of the present invention;

FIG. 10 shows an arrangement of a semiconductor integrated circuit according to a second embodiment of the present invention;

FIG. 11 shows an arrangement of a first modification of the second embodiment;

FIG. 12 shows an arrangement of the semiconductor integrated circuit according to a third embodiment of the present invention;

FIG. 13 shows an arrangement of a first modification of the third embodiment;

FIG. 14 shows an arrangement of a second modification of the third embodiment;

FIG. 15 shows an arrangement of a second modification of the second embodiment;

FIG. 16 shows a modification of a part of the circuit of the second modification shown in FIG. 15;

FIG. 19 shows a modification of the second embodiment shown in FIG. 10;

FIG. 20 shows an arrangement of a semiconductor integrated circuit according to a fourth embodiment of the present invention;

FIG. 21 shows a first modification of the fourth embodiment;

FIG. 22 shows a second modification of the fourth embodiment;

FIG. 23 shows a second modification of the first embodiment;

FIG. 24 shows an arrangement of a booster according to the present invention;

FIG. 28 shows a modification of a part of the circuit of the first modification of the booster;

FIG. 30 shows a first modification of the 25 improvement shown in FIG. 29;

FIG. 31 shows a circuit for generating a signal used in the modifications in FIGS. 29 and 30;

FIGS. 32A and 32B show an improvement of the conventional semiconductor memory shown in FIGS. 8A and 8B;

FIGS. 33A and 33B show detailed arrangements of a select signal generator shown in FIGS. 36A and 36B;

FIGS. 36A and 36B show a modification of the improvement shown in FIGS. 32A and 32B;

FIG. 37 shows a detailed arrangement of the write control signal generator and the write load circuit of the modification shown in FIGS. 36A and 36B.

DESCRIPTION OF THE PREFERRED EMBODIMENTS

A semiconductor integrated circuit according to the present invention will be described hereinafter with reference to the accompanying drawings.

Figure 1:
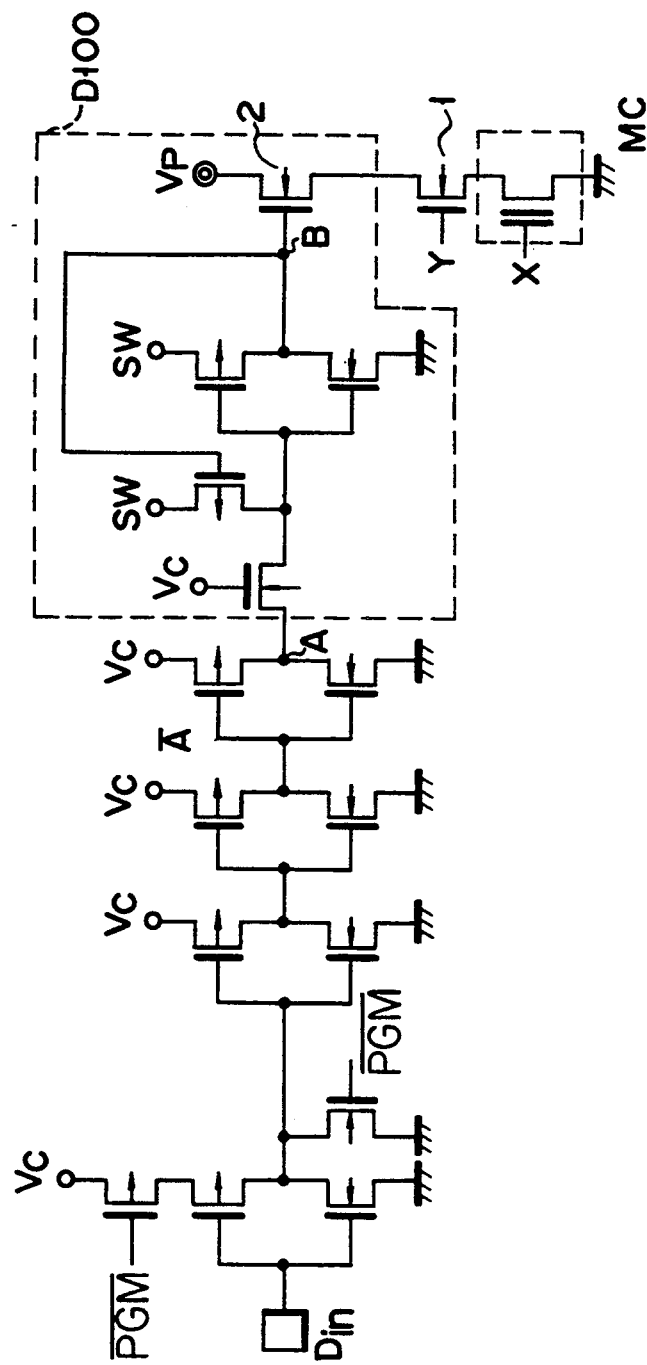
FIG. 1 shows an arrangement of a conventional nonvolatile semiconductor memory.
Figure 2:
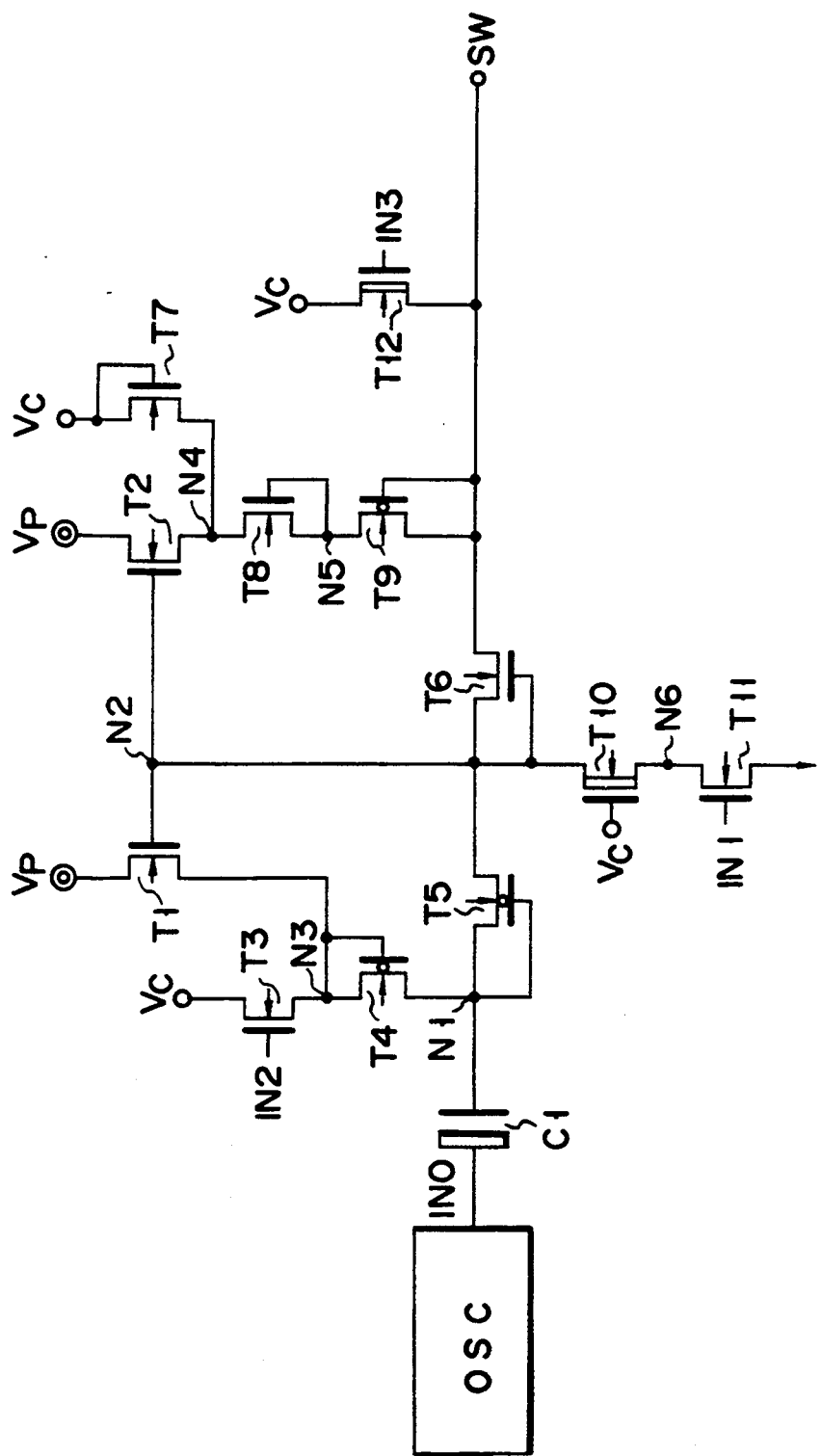
FIG. 2 shows an arrangement of a booster used in the conventional nonvolatile semiconductor memory.
Figure 3:
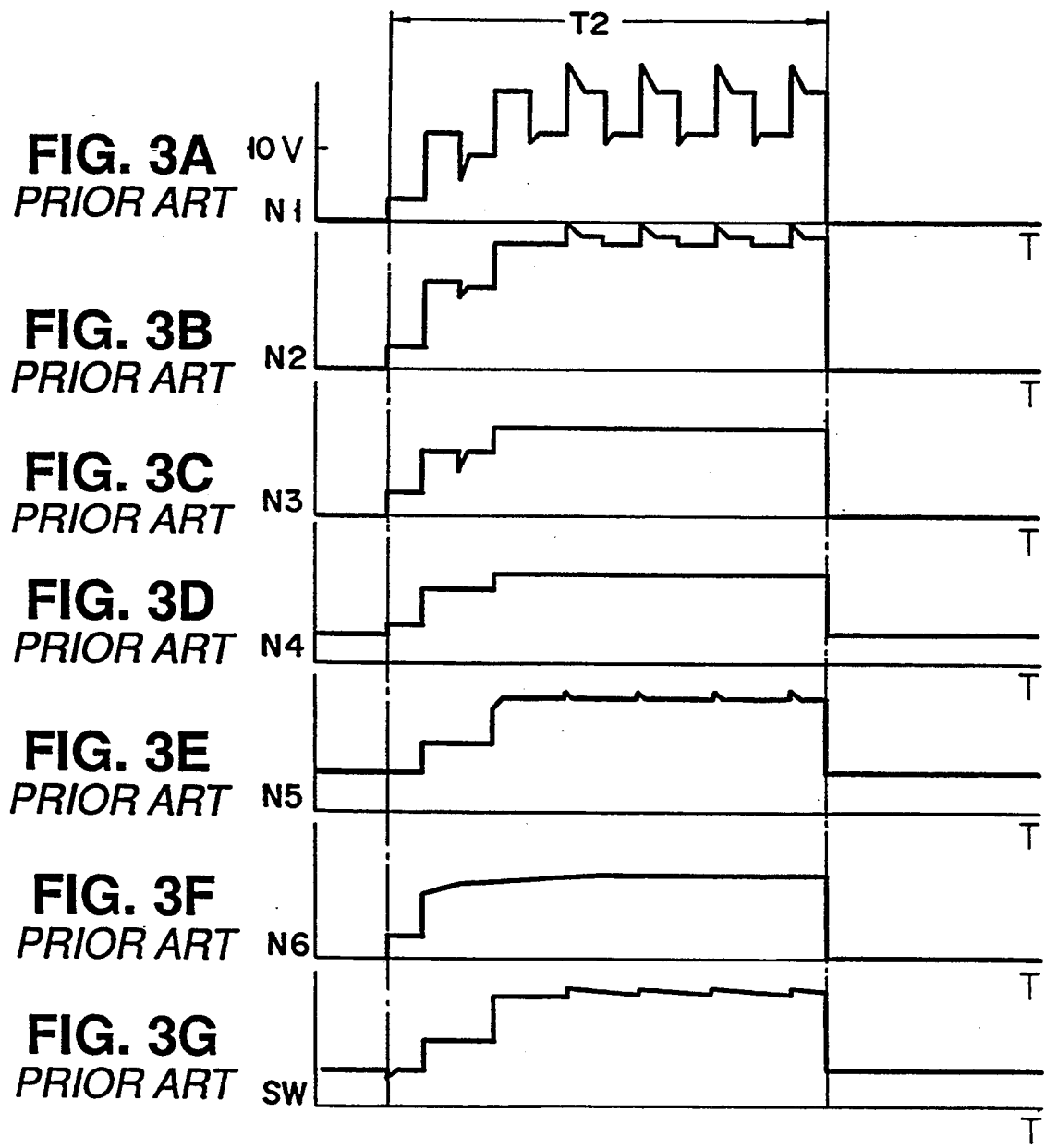
FIGS. 3A–3G and 4A–4F are waveform charts showing an operation of the booster shown in FIG. 2.
Figure 4:
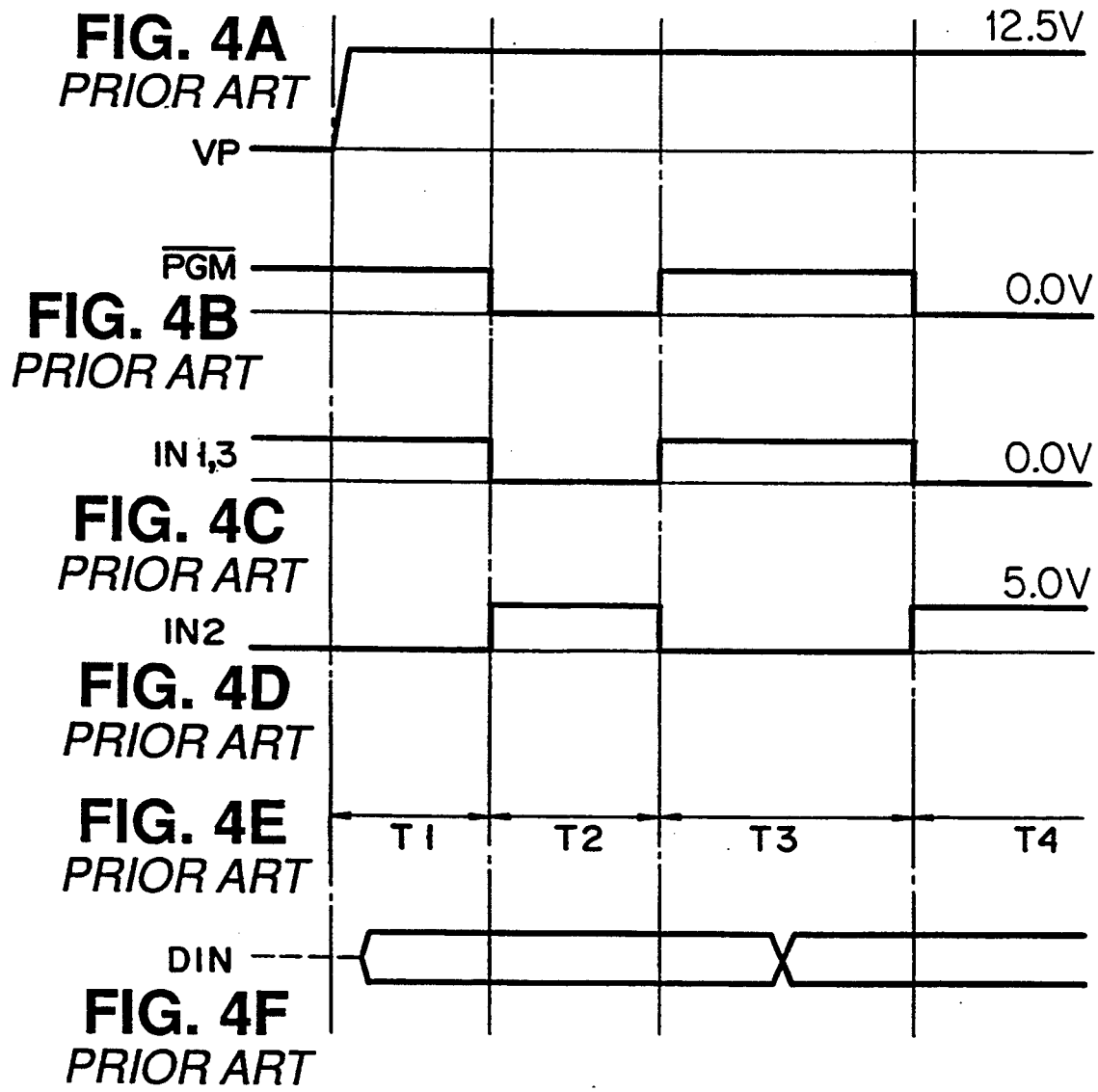

A semiconductor integrated circuit according to a first embodiment of the present invention will be described below with reference to FIG. 9. The circuit in this embodiment corresponds to a circuit D100 surrounded by a dotted line in FIG. 1. The node A shown in FIG. 1 corresponds to a node A shown in FIG. 9. In this embodiment, the transistor 2 in FIG. 1 is divided into first and second load transistors 2-1 and 2-2. Transistors 3, 4, 5, and 6 are connected in series with each other. One terminal of the transistor 6 is connected to a power source SW, and one terminal of the transistor 3 is connected to a ground potential. The transistors 2-1 and 2-2 are connected in series with each other. One terminal of the transistor 2-2 is connected to a power source Vp, and one terminal of the transistor 2-1 is connected to the transistor 1 shown in FIG. 1. A node B1 arranged between the transistors 4 and 5 is connected to the gate of the transistor 2-1, and a node B2 arranged between the transistors 5 and 6 is connected to the gate of the transistor 2-2. The gates of the transistors 5 and 6 are connected to the node B1. A transistor 7 whose gate is connected to the node A is connected between the node B2 and a power source Vc. The transistors 2-1, 2-2, 3, and 7 are of an n-channel enhancement type, and the transistors 4 to 6 are of an n-channel depletion type. The power source voltage Vc is normally used and its voltage is generally set to be 5 V.

In a program mode, a power source voltage Vp is set at a high-voltage level, and a power source voltage SW is equal to or higher than the voltage Vp. When a signal at the node A is set at "0" level, the transistor 3 is turned off, and the nodes B1 and B2 are charged toward the boosted power source voltage SW through the transistors 6 and 5. Consequently, the electric fields between the gates and the drains of the transistors 2-2 and 2-1 are weak. On the other hand, when a signal at the node A is set at "1" level, the transistor 3 is turned on, and the voltage of the node B1 is set to be about 0 V. At this time, since the transistor 7 is also turned on and the resistance of the transistor 5 is sufficiently increased, the voltage of the node B2 is set to be a voltage (Vc−VTH7) lower than the voltage Vc (5 V) by a threshold voltage VTH7 of the transistor 7. At this time, the transistor 6 is turned off. Thus, even if the signal at the node A is set at "1" level, the voltage of the node B2 connected to the gate of the second transistor 2-2 is increased to be higher than 0 V. Therefore, the breakdown voltage of the drain of the transistor 2-2 is increased by an increase in voltage at the node B2. Since the transistor 2-2 is directly connected to the external power source Vp, the transistor 2-2 is influenced by a change in the external power source Vp. In addition, since the external power source Vp has a large current supply capability, a transistor has a high probability that the transistor directly connected to the external power source Vp will be destroyed. Therefore, it is important to take the countermeasure mentioned above.

FIG. 10 shows an arrangement of a semiconductor integrated circuit according to a second embodiment of the present invention. The node A shown in FIG. 1 corresponds to a node A in FIG. 10. Transistors 8, 9, and 10 are connected in series with each other. One terminal of the transistor 10 is connected to a power source SW, and one terminal of the transistor 8 is connected to a ground potential. In this embodiment, the transistor 2 shown in FIG. 1 is also divided into first and second load transistors 2-1 and 2-2. The transistors 2-1 and 2-2 are connected in series with each other. One terminal of the transistor 2-2 is connected to a power source Vp, and one terminal of the transistor 2-1 is connected to the transistor 1 shown in FIG. 1. A node B1 between the transistors 8 and 9 is connected to the gate of the transistor 2-1, and a node B2 between the transistors 9 and 10 is connected to the gate of the transistor 2-2. The substrate of the transistor 9 is connected to its source, i.e., the node B2. The gate of the transistor 10 is connected to the node B1. The gates of the transistors 8 and 9 are connected to the node A. The transistors 2-1, 2-2, and 8 are of an n-channel enhancement type, and the transistor 10 is an n-channel depletion type. The transistor 9 is a p-channel enhancement type.

When a signal at the node A is a logic "0" the transistor 8 is turned off. However, since the transistor 9 is turned on, and the transistor 10 is also turned on, the nodes B1 and B2 are charged to a high-voltage level as in the embodiment shown in FIG. 9. Therefore, power source voltage Vp is applied to the transistor 1 through the transistors 2-2 and 2-1. When a signal at the node A is a logic "1" the transistor 8 is turned on, and the voltage of the node B1 is 0 V. However, since the transistor 10 is turned off, the voltage of the node B2 is an absolute value of the threshold voltage of the transistor 10. If the condition, $VA + |VTH9| > |VTH10|$, is satisfied, a current is not supplied from the power source SW. Reference symbol VA denotes a voltage set at "1" level of the signal at the node A; and VTH9 and VTH10, denote X threshold voltages of the transistors 9 and 10, respectively.

Similar to the embodiment shown in FIG. 9, when the signal at the node A is "1", the drain break-down voltage of the transistor 2-2 is increased in correspondence with an increase of the gate voltage and a decrease in the electric field between the gate and drain of the transistor 2-2 occurs, thereby preventing destruction of the gate insulating film.

FIG. 11 shows an arrangement of a modification of the second embodiment. Series-connected transistors 11 and 12 are inserted between the transistors 8 and 9 each having an arrangement shown in FIG. 10. A voltage Vc is applied to the gates of the transistors 11 and 12. The substrate of the transistor 12 is connected to the node B2. The transistors 11 and 12 are of n- and p-channel enhancement types, respectively, and the node between the transistors 11 and 12 serves as the node B1.

When the signal at the node A is set at "0" level, the transistor 8 is turned off. However, the transistor 9 is turned on. As a result, since the transistors 10 and 12 are turned on, the nodes B1 and B2 are charged to a high-voltage level. Therefore, the power source voltage Vp is applied to the transistor 1 through the transistors 2-2 and 2-1. When the signal at the node A is set at "1" level, the transistor 8 is turned on and the transistor 11 is kept on. Therefore, the voltage of the node B1 is set to be 0 V. However, the voltage of the node B2 is an absolute value of the threshold voltage of the transistor 10 in the same manner as in the arrangement shown in FIG. 10.

With the arrangement in FIG. 10, when the signal at the node A is set at "0" level, the drains of the transistors 8 and 9 are set at a high-voltage level. In this modification, voltage drops at the transistors 11 and 12 prevent the breakdown at the drains of the transistors 8 and 9.

FIG. 12 shows an arrangement of a semiconductor integrated circuit according to a third embodiment of the present invention. Transistors 15, 16, 17, and 18 are connected in series with each other. One terminal of the transistor 18 is connected to a power source SW, and one terminal of the transistor 15 is connected to a ground potential. In this embodiment, the transistor 2 shown in FIG. 1 is also divided into first and second load transistors 2-1 and 2-2. The transistors 2-1 and 2-2 are connected in series with each other. One terminal of the transistor 2-2 is connected to a power source Vp, and one terminal of the transistor 2-1 is connected to the transistor 1 shown in FIG. 1. A node B1 between the transistors 16 and 17 is connected to the gate of the transistor 2-1, and a node B2 between the transistors 17 and 18 is connected to the gate of the transistor 2-2. The gates of the transistors 16 and 17 are connected to a power source Vc. The gates of the transistors 15 and 18 are connected to a node N100. The gate of a transistor 14 is connected to the node B1, the source thereof is connected to the power source SW, and the drain thereof is connected to the node N100. A transistor 13 is inserted between the nodes A and N100, and the gate of the transistor 13 is connected to the power source Vc. The transistors 2-1, 2-2, 13, 15, and 16 are of an n-channel enhancement type, and the transistors 14, 17, and 18 are a p-channel enhancement type.

When the signal at the node A is set at "0" level, the node N100 is set at "0" level, i.e., 0 V, and the transistor 15 is turned off. However, the transistor 18 is turned on, and hence the transistor 17 is turned on. The nodes B1 and B2 are charged to a power source voltage SW. When the signal at the node A is set at "1" level, the transistor 15 is turned on and the transistor 16 is kept on. Therefore, the voltage of the node B1 is set to be about 0 V. As a result, the transistor 14 is turned on, and the node N100 is charged to have the voltage SW, so that the transistor 18 is turned off. The node B2 is held to have a voltage higher than a voltage Vc by an absolute value of the threshold voltage of the transistor 17.

In this embodiment, when the signal at the node A is "0", the voltage SW is supplied to the gates of the transistors 2-1 and 2-2. When the signal at the node A is "1", the potential of the gate of the transistor 2-2 is a predetermined value higher than 0 V and the electric field between the gate and drain of the transistor 2-2 is decreased to prevent the drain breakdown of the transistor 2-2 or destruction of the gate insulating film. In addition, the gate voltage of the transistor 2-1 is 0 V. So the transistor 2-1 is turned off. Therefore, the voltage Vp is not supplied to the memory cell. No current flows out from the power source SW.

FIG. 13 shows an arrangement of a first modification of the third embodiment shown in FIG. 12. A p-channel transistor 20 is inserted between the node B2 and the transistor 17, and the gate of the transistor 20 is connected to the node N100. A p-channel transistor 19 is inserted between the transistor 14 and the node N100, and the gate of the transistor 19 is connected to the power source Vc. Series-connected transistors 21 and 22 are connected to the node B2, and one terminal of the transistor 22 is connected to the power source Vc. The gates of the transistors 21 and 22 are connected to the power source Vc and the node A, respectively. The transistors 21 and 22 are of an n-channel depletion type.

In the arrangement shown in FIG. 12, when the signal at the node A is set at "0" level, the gate voltage of the transistor 14 is a voltage SW. However, in this arrangement, the transistor 19 is provided. Therefore, when the signal at the node A is set at "0" level, breakdown at of the drain of the transistor 14 is prevented. In addition, the voltage of the node B2 is equal to the voltage Vc because of the transistors 20, 21, and 22, when the signal at the node A is set at "1" level.

FIG. 14 shows an arrangement of a second modification of the third embodiment shown in FIG. 12. In this modification, the transistor 20 in the arrangement shown in FIG. 13 is omitted.

In the same manner as in the arrangement in FIG. 13, the transistor 19 is provided, so that breakdown at the drain of the transistor 14 is prevented when the signal at the node A is set at "0" level. In order to eliminate a floating state of the node B2, because of turning-off of the transistor 18 in FIG. 12, the transistors 21 and 22 maintain the voltage of the node B2 at the voltage Vc.

FIG. 15 shows an arrangement of another modification of the second embodiment shown in FIG. 10. In this modification, an n-channel transistor 24, the gate of which is connected to the power source Vc, is inserted between the transistor 8 and the node B1. An n-channel depletion type transistor 27, the gate of which is connected to the node B2, is inserted between the power source SW and the transistor 10. In addition, series-connected n-channel depletion type transistors 28 and 29 are connected between the node B2 and the power source Vc, and one terminal of the transistor 29 is connected to the power source Vc. The gates of the transistors 28 and 29 are connected to the power source Vc and the node A, respectively.

The transistor 24 suppresses the drain voltage of the transistor 8 within a predetermined voltage to prevent the drain breakdown of the transistor 8 when the signal at the node A is set at "0" level, and the transistor 27 suppresses the drain voltage of the transistor 10 so as not to exceed the predetermined voltage and to prevent the drain breakdown of the transistor 10 when the signal at the node A is set at "1" level. In addition, when the signal at the node A is set at "1" level, the transistors 28 and 29 maintain the voltage of the node B2 to the voltage Vc, and a breakdown voltage of the second load transistor 2-2 is increased. Since the voltage at the node B1 is set to be 0 V, the transistor 2-1 is turned off.

Note that a transistor 30 shown in FIG. 16 may be used in place of the transistors 28 and 29.

Figure 17:
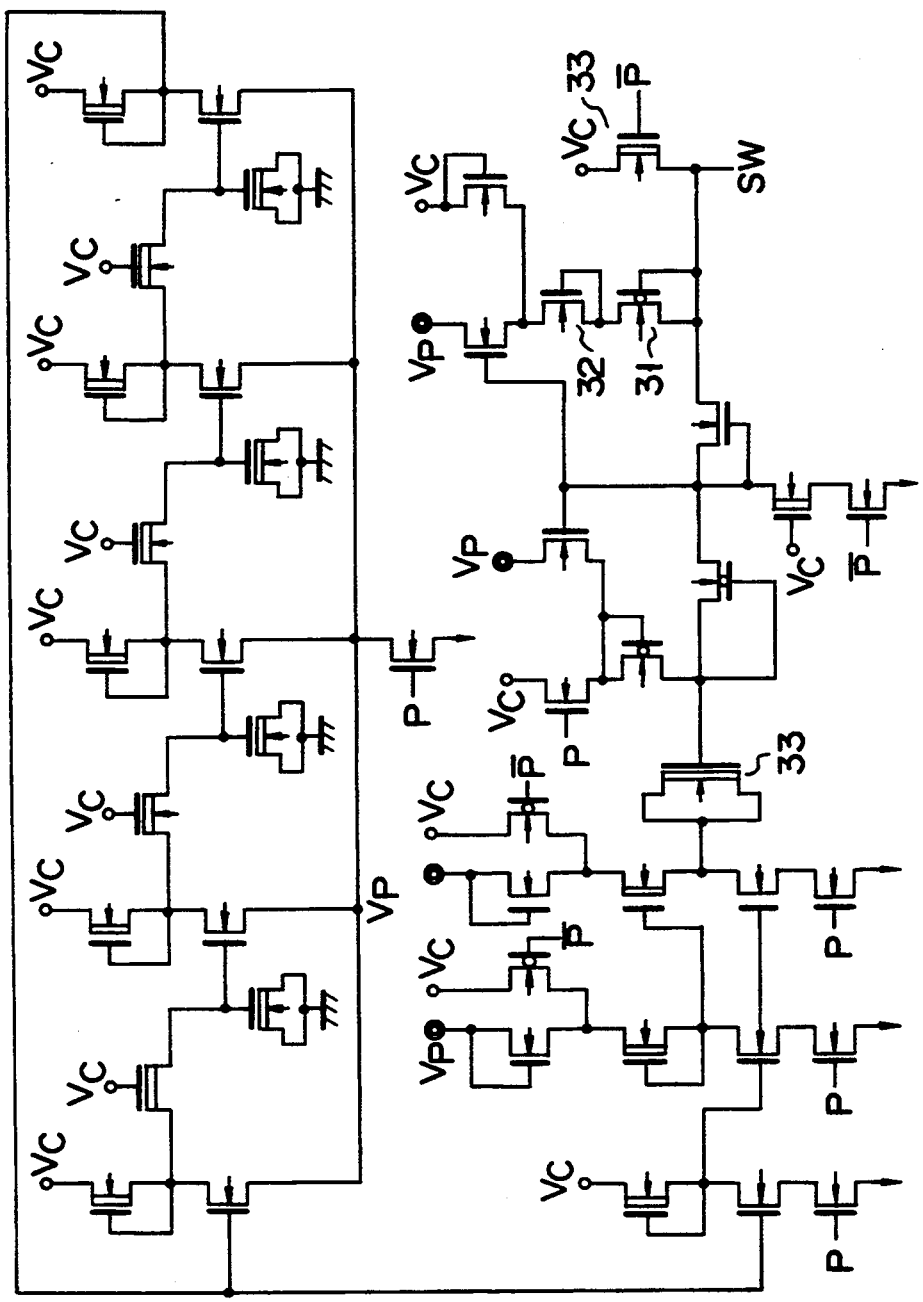
FIG. 17 shows an arrangement of a booster for 25 outputting a power source voltage SW.

FIG. 17 shows an arrangement of a booster for outputting the power source voltage SW. The booster is set in a program mode when a signal $\overline{P}$ is set at "0" level and a signal P is set at "1" level, and the voltage SW higher than the voltage Vp by a sum of the threshold voltages of transistors 31 and 32 is output. A boosted voltage can be obtained in a capacitor 33 and a circuit in the former stage. In a normal read mode, the signal $\overline{P}$ goes to "1" level, and the voltage Vc is output as the power source voltage SW.

Figure 18:
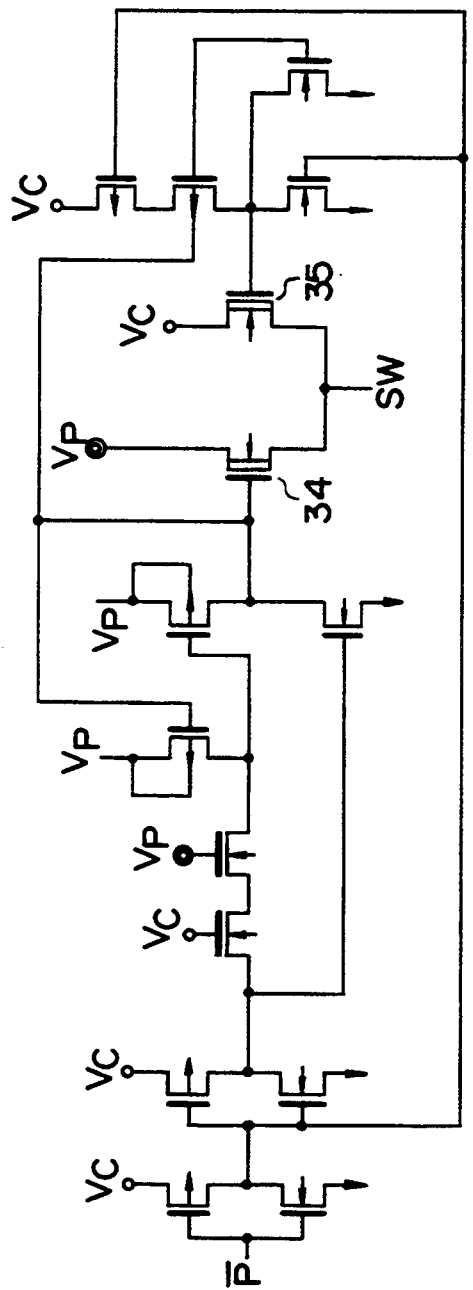
FIG. 18 shows another arrangement of the booster for outputting the power source voltage SW.

The present invention can also be applied to a case wherein a voltage obtained by boosting the voltage of the power source SW to be higher than the voltage Vp is not used. In the arrangement shown in FIG. 18, in a program mode (when the signal $\overline{P}$ is set at "0" level), the voltage Vp is output as the power source voltage SW through the transistor 34. In a read mode, the voltage Vc is output through the transistor 35. The embodiments shown in FIGS. 9 to 16 have the advantage that a current cannot be supplied from the power source SW. More specifically, in FIG. 9, when the signal at the node A is set at "1" level, a current is undesirably grounded from the power source Vc through the transistors 7, 5, 4, and 3. However, since the voltage at the node B1 is set to be about 0 V, the transistor 6 is turned off so no current flows from the power source SW. In FIG. 10, if the signal at the node A is set at "1" level, the transistors 9 and 10 are off. Therefore, no current is flowed across the power source SW and ground.

As described above, the two write load transistors 2-1 and 2-2 are arranged in the above embodiments. Voltage application is performed in accordance with write data. When write data is first data, a voltage equal to or higher than an externally supplied program voltage is applied to the gates of the two load transistors 2-1 and 2-2. On the other hand, when the write data is second data, the voltage of the gate of the second load transistor 2-2 in the program power source side is set to be lower than the program voltage and higher than 0 V to increase the drain breakdown voltage of the transistor 2-2, thus allowing use of a MOSFET micropatterned by the microlithography technique. The gate voltage of the first load transistor 2-1 in the memory cell side is set to be 0 V, and the transistor is turned off, thus, a program voltage is not supplied to the memory cell.

FIGS. 19 to 22 show other modifications of the above embodiments. The power source SW is divided into power sources SW1 and SW2 respectively shown in FIGS. 17 and 18.

FIG. 19 shows an arrangement of a modification of arrangement shown in FIG. 10. Series-connected transistors 90, 89, 80, 81, 86, 87, and 88 are arranged between the power source SW1 and the ground potential. The node B1 between the transistors 89 and 80 is connected to the gate of the transistor 2-1, and the node B2 between the transistors 86 and 87 is connected to the gate of the transistor 2-2. One terminal of the transistor 2-1 is connected to the transistor 1 shown in FIG. 1, and one terminal of the transistor 2-2 is connected to the power source Vp. Series-connected transistors 84 and 85 are inserted between the node B2 and the power source Vc. Series-connected transistors 83 and 82 are inserted between a connection node N102 of the transistors 81 and 86 and the power source SW2. The gates of the transistors 84 and 90 are connected to the node A, the gates of the transistors 89, 81, and 85 are connected to the power source Vc, the gates of the transistors 80, 86, and 87 are connected to the node B1, and the gate of the transistor 88 is connected to the node B2. The gate of the transistor 82 is connected to the power source SW1, the gate of the transistor 83 is connected to a node N104, and the substrate of the transistor 81 is connected to the node N102.

In this modification, in any mode except for a program mode, the node A is set at a logic "1" level, and voltages SW1 and SW2 are set at the same level as that of the voltage Vc. At this time, the voltage of the node B2 is set to be the voltage Vc, and the voltage of the node B1 is set to be 0 V. The transistor 2-1 is turned off, and a current is not supplied from the program power source Vp through the transistors 2-1 and 2-2. The voltage of the power source SW1 is also set to be the voltage Vc, and the voltage is applied to the gate of the transistor 82. Therefore, the voltage Vc is applied to the gate of the P channel transistor 81, and hence a voltage higher than a voltage (Vc+|Vth 81|) (Vth 81 indicates a threshold voltage of the transistor 81) is not applied to the source of the transistor 81 through the transistors 82 and 83, and the transistor 81 is kept off. A current is not supplied through the transistors 84 and 85 because the transistors 81 is off. When the voltage Vp is increased, the voltage of the gate of the transistor 2-2 is set at a voltage Vc level, and hence the drain breakdown voltage of transistor 2-2 is increased, and an electric field between the drain and the gate of the transistor 2-2 decreases.

When data is written into the memory cell, the power source voltage SW1 is boosted to a voltage higher than the voltage Vp, and the power source voltage SW2 is set to be equal to the voltage Vp. At this time, when the node A is set at "1" level, the transistor 90 is turned on, and, hence, the voltage of the node B1 is set to be 0 V. The transistors 86 and 87 are turned off, and the voltage of the node B2 is set equal to the voltage Vc. At this time, a current is not supplied from the power source SW1 having a boosted voltage. When the node A is set at "0" level, the transistors 84 and 90 are turned off. Therefore, the nodes B1 and B2 are charged to have a boosted voltage by the power source voltage SW1 through the transistors 88, 87, 86, 81, and 80. At this time, the transistor 83 prevents current from flowing from the power source SW1 to the power source SW2. Note that the power source SW1 can be used as the power source SW2 in this modification. If a boosting operation is not required, the power source voltages SW1 and SW2 may be equal to the voltage Vp.

FIG. 20 shows a circuit arrangement according to a fourth embodiment of the present invention corresponding to the arrangement shown in FIG. 1.

Transistors 104, 105, and 106 are connected in series between a power source Vc and a ground potential. A transistor 107 is inserted between the power source Vc and a connection node N110 of the transistors 104 and 105. Transistors 99, 98, and 97 are inserted between a node B2 and the ground potential, and a transistor 103 is inserted between the transistor 97 and the node N110. Transistors 91, 92, 93, 94, 95, and 96 are connected in series between a power source Vp and the ground potential. The connection node B2, between the transistors 92 and 93, is connected to the gate of transistor 2-2, and a connection node B1, between the transistors 94 and 95, is connected to the gate of the transistor 2-1, in the same manner as in FIG. 9. Series-connected transistors 100, 101, and 102 are inserted between the power sources Vp and Vc. A connection node B3, between the transistors 100 and 101, is connected to the gate of the transistor 91.

A signal $\overline{Din}$ is supplied to the gates of the transistors 107 and 105. A signal P is supplied to the transistors 104 and 106, respectively. The gates of the transistors 103, 98, 95, and 93 are connected to the power source Vc. The gate of the transistor 99 is connected to a connection node N112 of the transistors 99 and 98, and the gate of the transistor 96 is connected to the node N110. The gate of the transistor 94 is connected to the node B1, and the gate of the transistor 92 is connected to the node B2. The gates of the transistors 100 and 101 are connected to the node B3, and the gate of the transistor 102 is connected to the connection node between the transistors 101 and 102. The substrates of the transistors 91 and 93 are connected to the power source Vp and the node B2, respectively.

The transistors 91, 93, 104, and 107 are p-channel transistors, and the other transistors are n-channel transistors. The transistors 92, 94, 95, 100, 99, 98, and 103 are of a depletion type.

In this embodiment, an input P is set at a logic "0" level in any mode except for when data is written in the memory cell, and a voltage Vp is a voltage Vc or less in a read mode. In the read mode, the transistors 96 and 97 are turned on, and the transistor 91 is turned off. Therefore, the voltages of the nodes B1 and B2 are set to be 0 v, and the transistors 2-1 and 2-2 are OFF.

When data is written into the memory cell, the signal P is set at "1" level, thus increasing the voltage Vp to a high-voltage level. If the voltage Vp is increased to be equal to or more than the absolute value of the threshold voltages of the transistors 101, 102, and 91, the transistor 91 is turned on.

When write data $\overline{Din0}$ is set at "0" level, i.e., electrons are not injected in a floating gate of the memory cell, the transistors 96 and 97 are turned on, and the voltage of the node B2 is set to be a predetermined voltage higher than 0 V because of the resistances of the transistors 91, 92, and 97 to 99. The voltage of the node B1 is set to be about 0 V. Therefore, the transistor 2-1 is kept off. When the data $\overline{Din}$ is set at "1" level, the transistors 96 and 97 are turned off. Therefore, the nodes B1 and B2 are charged to the voltage Vp through the transistors 91 to 94.

The drain breakdown voltage of the transistor 2-1 is the lowest when the transistor 2-2 has the lowest gate voltage, and at this time, the gate voltage is set to be a predetermined voltage higher than 0 V. Therefore, the drain breakdown voltage in this invention can be set to a higher value than that in the conventional one. In addition, an electric field between the gate and drain of the transistor 2-2 can be decreased. Therefore, a transistor having a thin gate insulating film can be used. Further, the voltage at the gate of transistor 2-1 is set to be about 0 V to turn the transistor 2-1 off, resulting in not supplying the voltage to the memory cell. Even when the voltage of the gate of the transistor 2-1 is set to be 0 V, the voltage of the drain thereof is not increased over the predetermined voltage due to the transistor 2-2, thereby the drain of the transistor 2-1 does not break down.

When the voltage of the power source Vp is high, the voltage at the gate of the transistor 91 is substantially equal to a sum of the voltage Vc and the combined threshold voltages of the transistors 101 and 102. Therefore, the drain breakdown voltage of the transistor 91 is increased, and the electric field between the gate and drain of the transistor 91 is also decreased. More specifically, in the embodiment shown in FIG. 20 a voltage difference between the gate and drain of any transistor is smaller than the voltage Vp.

FIG. 21 shows an arrangement of a modification of the circuit D110 which is a part of the fourth embodiment shown in FIG. 20. Transistors 111, 112, 113, 114, and 115 are connected in series between the power source Vp and the ground potential. A connection node B2 between the transistor 112 and 113 is connected to the gate of the transistor 2-2, and a connection node B1 between the transistors 113 and 114 is connected to the gate of the transistor 2-1, in the same manner as in FIG. 9. The transistors 2-2 and 2-1 are connected in series with each other. Transistors 117, 118 and 119 are connected in series between the power sources Vp and Vc. A connection node B4 between the transistors 117 and 118 is connected to the gates of the transistors 111, 117, and 118. A node N110 is connected to the gate of the transistor 115. The gate of the transistor 114 is connected to the power source Vc. The gate of the transistor 113 is connected to the node B1, and the gate of the transistor 112 is connected to the node B2. The gate of the transistor 119 is connected to a connection node N120 between the transistors 118 and 119. The substrate of the transistor 111 is connected to the power source Vp. The transistor 111 is a p-channel transistor, and all the other transistors are n-channel transistors. The transistors 112, 113, 114, and 117 are of a depletion type, and the threshold voltage of the transistor 118 is set to be about 0 V.

In this modification, in any mode except for a program mode, the node N110 is set at logic "1" level. When the voltage Vp is equal to the voltage Vc or less, the transistor 111 is turned off. Therefore, the voltages of the nodes B1 and B2 are set to be 0 V. When the voltage Vp is increased to a high-voltage level, the voltage at the node B4 is approximately equal to (Vc+Vth118+Vth119) (where Vth118 and Vth119 are threshold voltages of the transistors 118 and 119). When the voltage Vp is equal to (Vc+Vth118+Vth119+|Vth111|) or more, the transistor 111 is turned on. As a result, the voltages of the nodes B1 and B2 are set to be predetermined values through transistors 112 and 113. When the transistor 115 is turned on due to a logic "1" at the node N110, if the resistances of the transistors 111 to 115 are properly determined, the voltage of the node B1 can be set to be about 0 V, and the voltage of the node B2 can be about 5 V. When the node N110 is set at "0" level, the voltages of the nodes B1 and B2 are charged to be the voltage Vp.

FIG. 22 shows an arrangement of another modification of the circuit D110 which is a part of the fourth embodiment shown in FIG. 20. In the circuit shown in FIG. 21, an n-channel depletion type transistor 120 is connected between the node N120 and the power source Vc. The transistor 120, having a gate to which a signal SVpp is supplied, the signal SVpp being set to a logic "1" when it is sensed that the voltage Vp went to a high level, is arranged to carry out the following purpose. In general, a high-voltage sensor is arranged in such a semiconductor integrated circuit to sense the level of the power source voltage Vp. When the power source voltage Vp exceeds a predetermined value, the sensor outputs the signal SVpp of a logic "1" level. In other words, the sensor senses that the power source voltage Vp is increased to be the predetermined value or more, and transitions to a program mode. When the signal SVpp is set at "1" level, the transistor 120 is turned on, and the connection node N120 between the transistors 118 and 119 is connected to the power source Vc. If the predetermined voltage is denoted by a reference symbol VA, the threshold voltages of the transistors 111, 118, and 119 may be determined to satisfy the inequality (Vc+Vth118+Vth119+Vth111 > VA > Vc+Vth118+Vth111). Therefore, the power source voltage Vp is increased, and the transistor 111 is turned on in a program mode wherein the voltage Vp exceeds the voltage VA. As a result, all the circuits in this semiconductor integrated circuit are substantially simultaneously set in the program mode. Other operations are the same as those in FIG. 21.

FIG. 23 shows an arrangement of a modification of the arrangement shown in FIG. 19 in which power source voltages SW1 and SW2 are used. In the arrangement shown in FIG. 23 transistors 123, 124, 125, 126, 127, 128, and 129 are connected in series between the power source SW1 and the ground potential. The node B1 between the transistors 128 and 127 is connected to the gate of the transistor 2-1 (not shown), and the node B2 between the transistors 125 and 124 is connected to the gate of the transistor 2-2 (not shown). Series-connected transistors 121 and 122 are inserted between the node B2 and the power source Vc. Series-connected transistors 131 and 130 are inserted between the power source SW2 and a connection node N130 between the transistors 125 and 126. The gates of the transistors 121 and 129 are connected to the node A, the gates of the transistors 122, 126, and 128 are connected to the power source Vc, the gates of the transistors 124, 125, and 127 are connected to the node B1, and the gate of the transistor 123 is connected to the node B2. The drain and gate of the transistor 130 are connected to the power source SW2, the gate of the transistor 131 is connected to the node N130, and the substrate of the transistor 126 is connected to the node N130. The transistors 121, 122, 123, 124, 125, 127, 128, and 131 are n-channel depletion type transistors, and the transistor 126 is a p-channel transistor.

In this arrangement, when the power source voltages SW1 and SW2 are set at a voltage Vc level, the signal at the node A is set at a logic "1" level. At this time, since the transistor 129 is turned on, the voltage of the node B1 is set to be 0 V. Since the gate of the transistor 121 is set at "1", the node B2 is set at a potential equal to a voltage Vc. At this time, since the transistor 126 is turned off, no current flows from the power sources vc, SW1 and SW2. When potentials of the voltages SW1 and SW2 are increased, while the signal at the node A is set at "1", a current is supplied through the transistors 130, 131, and 126 to 129. However, by properly setting the ON resistance of each transistor, the voltage of the node B1 can be kept at about 0 V. The transistors 124 and 125 are kept OFF, and the voltage of the node B2 is not changed from the voltage Vc level.

When the signal at the node A is set at "0" while SW1 and SW2 are set at a high-voltage level, the transistors 121 and 129 are turned off, and the nodes B1 and B2 are set to the same potential as the power source SW1. Note that the power source voltage SW2 may equal the power source voltage Vp. Even if the signal at the node A is set at "1" level and the transistor 129 is turned on, current is not supplied from SW2 because of the presence of the transistors 130 and 126 unless the voltage value of SW2 exceeds (Vc+|Vth126|+Vth130).

Figure 25:
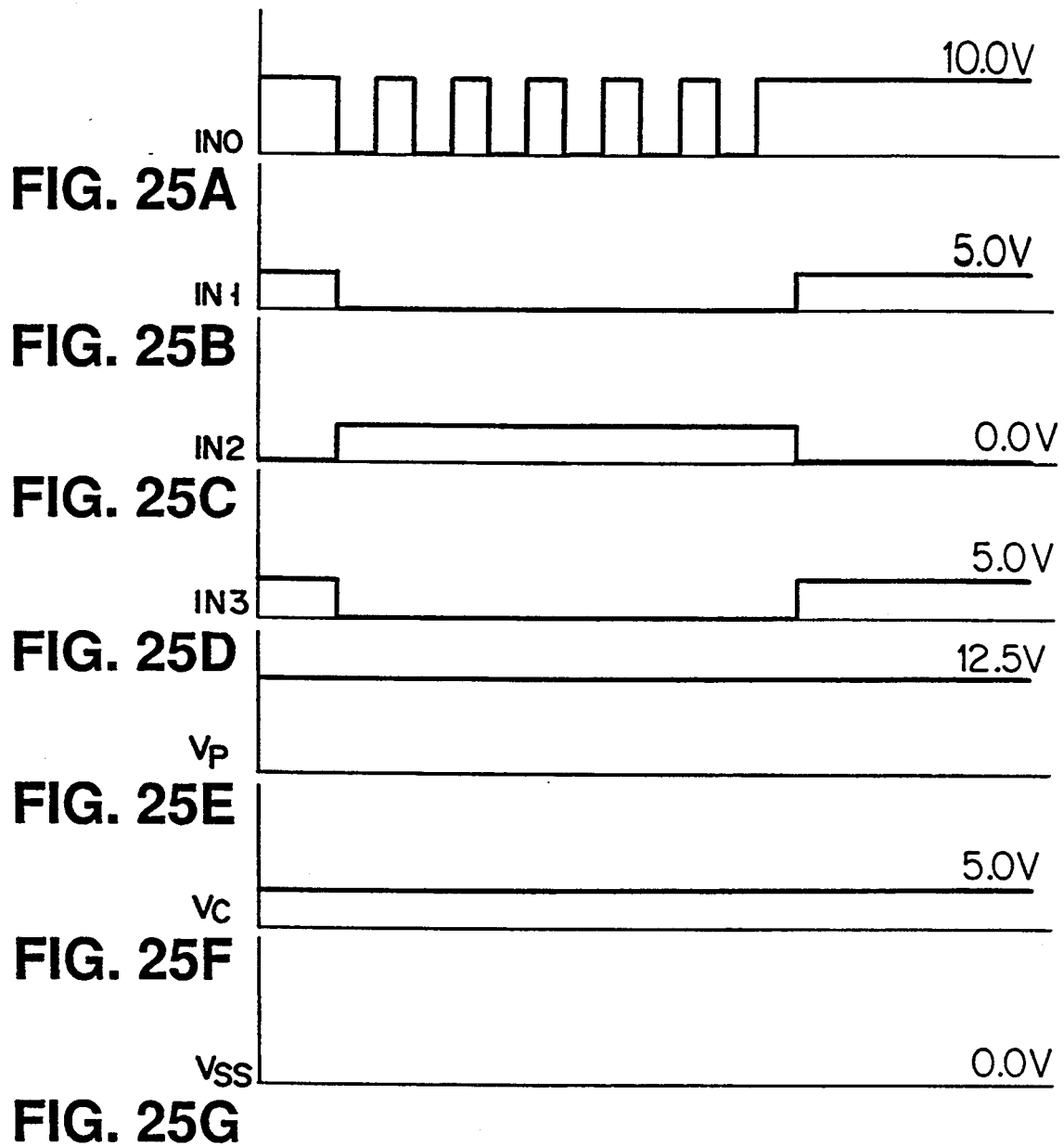
FIGS. 25A–25G and 26A–26L are signal waveform charts for explaining an operation of the booster shown in FIG. 24.
Figure 26:
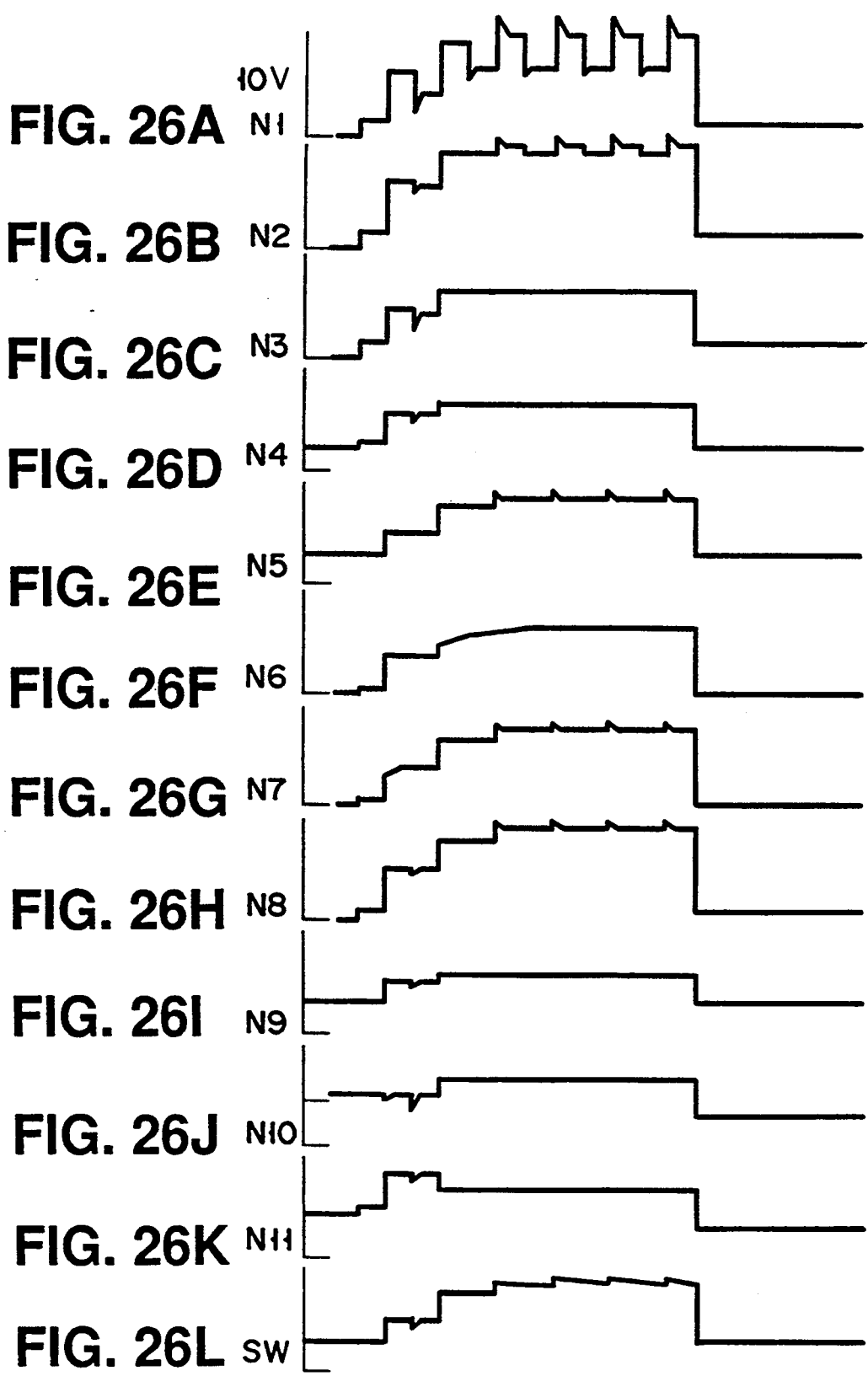

FIG. 24 shows an arrangement of a booster according to the present invention. FIGS. 25 and 26 are signal waveform charts for explaining an operation of the embodiment. Signals IN1 to IN3 are supplied from a control circuit C100.

In this arrangement, an output from an oscillator 141 is input to one terminal of a NOS capacitor C1, and the other terminal of the MOS capacitor C1 is connected to a node N1. The source of a transistor T4 is connected to the node N1. The gate and the drain of the transistor T4 are connected to a node N3, and the node N3 is connected to the source of a transistor T1. The gate and the drain of a transistor T5 are connected to the node N1, and the source of the transistor T5 is connected to the gate of the transistor T1 to constitute a node N2. The drain of the transistor T1 is connected to the source of a transistor T13, and a node therebetween serves as a node N10. The drain of the transistor T13 is connected to the power source Vp, and the power source Vp is set to be 12.5 V in a program mode, and is set to be 5 V (equal to the voltage Vc) in a read mode. The gate of the transistor T13 is connected to the output of this circuit as the power source SW. A drain and a gate of a transistor T6 are connected to the node N2. Transistors T14, T2, T8 and T9 are connected in series between the power source Vp and the source of the transistor T6. The source of the transistor T6 is connected to a node N12 as the output of this circuit. Nodes N11, N4 and N5 are between the transistors T14 and T2, between the transistors T2 and T8 and between the transistors T8 and T9. A transistor T7 is connected between the power source Vc and the node N4. Series connected transistors T12 and T17 are arranged between the power source Vc and the node N12. The gates of the transistors T14, T2, T8, T9 and T17 are connected to the node N12, the node N2, the node N5 and the node N12 and the power source Vc, respectively. Transistors T10 and T11 are connected to the node N2 in series. The gate of the transistor T10 is connected to the power source Vc, and the gate of the transistor T11 is supplied with a signal IN1 from a control circuit C100. The control circuit C100 generates signals IN2 and IN3 as well as the signal IN1. The signal IN3 is supplied to the gate of the transistor T12. The signal IN2 is coupled to a gate of a transistor T3 connected between the power source Vc and the node N3.

With such a circuit arrangement, the gate potentials the transistor T13 and T14 are not decreased to be the voltage Vc or less, and a potential difference with the drain voltage Vp is decreased as compared with that in the conventional circuit. As a result, the drain breakdown is increased and the electric field between the gate and drain is decreased. More specifically, a potential difference between the gate and the drain of this transistor T13 is set to be (Vp−Vc), and this potential difference is decreased by the voltage vc as compared with the conventional voltage Vp.

Since the potential of the node N10 is set to be (Vc Vth113), a strong electric field is not applied to the transistor T1. The power source voltage SW is set at a voltage Vc level in a read mode, and is set at a boosted high-voltage level in a program mode. Since an input signal IN1 is set at "1" level in a read mode, a discharge operation is performed, so that the node N2 connected to the gate of the transistor T1 is set to be 0 V. In a program mode, the voltage level of the node N2 is set at a boosted high-voltage level.

The potential difference between the nodes N10 and N2 is decreased, as compared with that in the conventional circuit arrangement. Therefore, an intensity against breakdown is increased. Some countermeasures against breakdown are taken for other elements. The voltage of a signal IN3 input to the gate of a transistor T12 is set to be 0 V in a program mode, and the level of the output voltage SW is set at a boosted high-voltage level. Therefore, a transistor T17 is arranged on a source side of the transistor T12, and the potential difference between the gate and source of the transistor T12 is suppressed. More specifically, the potential difference between the gate and the source of the transistor T12 is suppressed to be (Vp−Vc), and the voltage of a node N9 does not exceed (Vc+|VTH17|). Note that reference symbol VTH17 denotes a threshold value of the transistor T17. A transistor T14 functions in the same manner as the transistor T13, as a matter of course.

Figure 27:
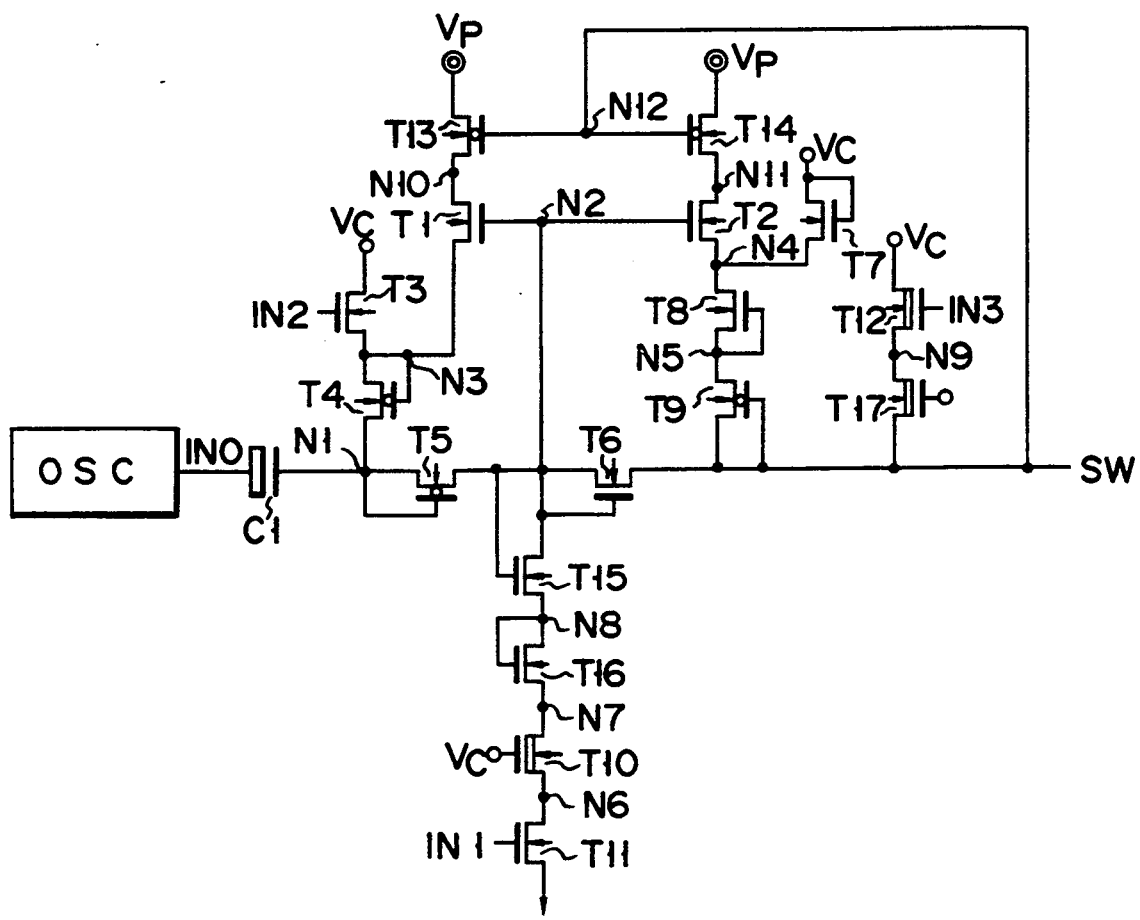
FIG. 27 shows a first modification of the booster shown in FIG. 24.

FIG. 27 shows an arrangement of a modification of the circuit shown in FIG. 24. Series-connected transistors T15 and T16 are inserted between the transistor T10 and the node N2. The gates of the transistors T15 and T16 are connected to the nodes N2 and N8, respectively. The node N8 is the connection node between the transistors T15 and T16.

Similar to the embodiment shown in FIG. 24, the gate of a transistor T11 is supplied with the signal IN1 of 0 V in a program mode. The drain of a depletion type transistor T10 is supplied with a potential lower than the potential at the node N2 by the threshold voltages of transistors T15 and T16 through the transistors T15 and T16 connected in series with each other. In this booster, the node N1 has the highest voltage. However, when the voltage of the node N1 is highest, the voltage of the node IN0 is also highest. Therefore, the potential difference at the capacitor C1 is not increased. The node N2 has the second highest potential next to that of the node N1. For this reason, even if the gate voltage of the transistor T10 is set to be a voltage Vc, a potential difference between the gate and the drain of the transistor T10 is often too large, and the transistors T15 and T16 are arranged to compensate for it. In this arrangement, the voltage of the power source SW is set at a boosted high-voltage level in a program mode, and is set at a Vc level in other modes. Therefore, the voltage SW is applied to the gates of the transistors T13 and T14. However, when the voltage Vp is set at a high-voltage level, the voltage Vp may be higher than 0 V. More specifically, the gate voltage may be set such that the gate insulating films of the transistors T13 and T14 are not damaged, and that the voltage between the drain and the gate can be maintained. For this reason, as shown in FIG. 28, resistors may be divided so that the voltage Vp can be obtained in a write mode, and that a potential lower than the voltage Vp can be obtained in other modes.

Two main factors to destroy the gate insulating film are: (1) a decrease in thickness of the gate insulating film; and (2) a large potential difference between the gate and the drain or the source. In the arrangements shown in FIGS. 24 and 27, countermeasures are taken such that the large potential difference (factor (2)) of a circuit portion is decreased so as not to destroy the gate insulating film.

Figure 5:
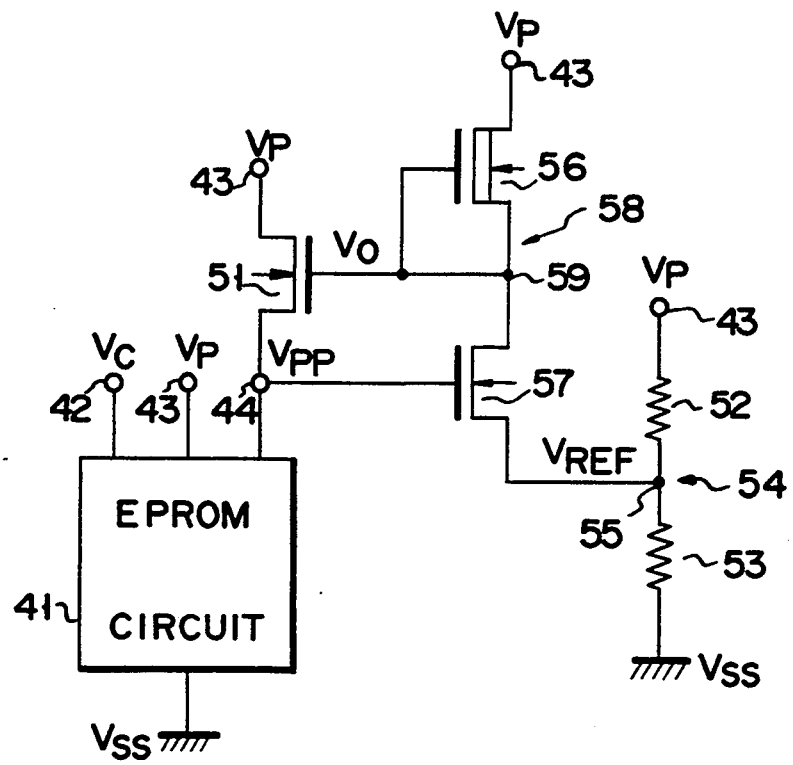
FIG. 5 shows an arrangement of the conventional nonvolatile memory including a circuit to obtain a stable internal power source voltage from a fixed high power source voltage.
Figure 29:
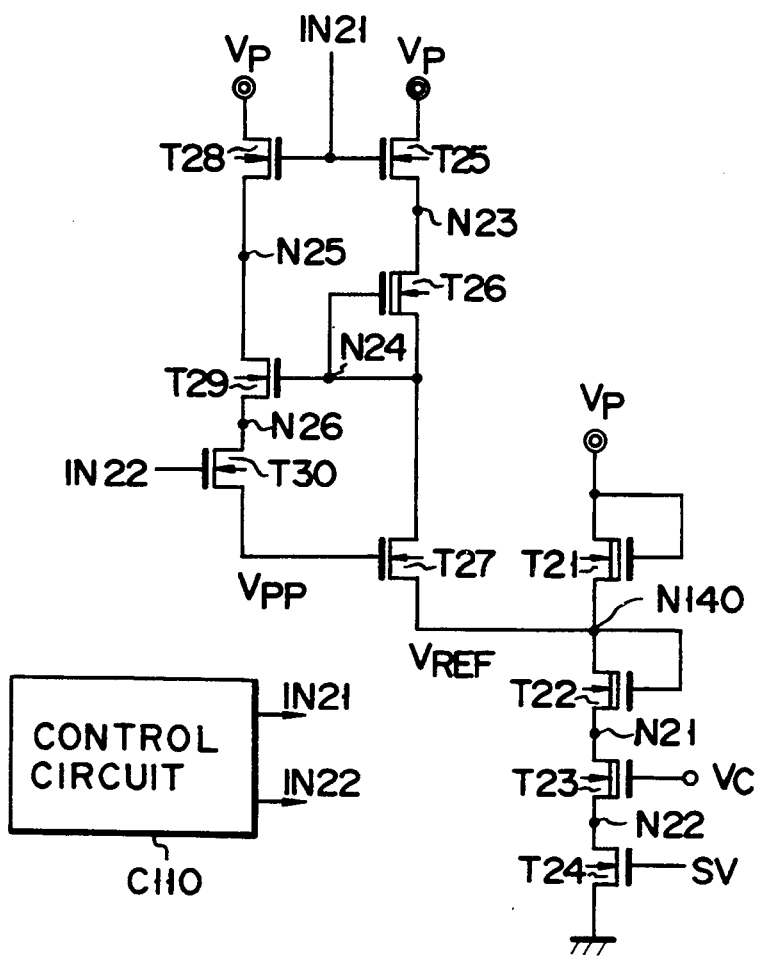
FIG. 29 shows an improvement of a part of the circuit of the conventional semiconductor memory shown in FIG. 5.

FIG. 29 shows an improvement of a part of the 10 arrangement of the nonvolatile memory shown in FIGS. 5 and 6. Series-connected transistors T21, T22, T23, and T24 are inserted between the power source vp and the ground potential. Series-connected transistors T25, T26, and T27 are inserted between the power source Vp and a connection node N140 defined between the transistors T21 and T22. Series-connected transistors T28, T29, and T30 are inserted between the power source Vp and the gate of the transistor T27. A signal IN21 is supplied from a control circuit C110 to the gates of the transistors T25 and T26, a signal IN22 is supplied to the gate of the transistor T30, and a signal SV is supplied to the gate of the transistor 24.

The gates of the transistors T26 and T29 are connected to a connection node N24 of the transistors T26 and T27, and the gates of the transistors T21, T22, and T23 are connected to the power source Vp, a node N140, and the power source Vc, respectively.

The signal IN21 input to the gates of the transistors T25 and T28 is set at a boosted potential level higher than drain voltages Vp of the transistors T25 and T28 in a program mode, and is set at a normal power source voltage Vc level (e.g., 5 V) in a read mode. The voltage of the signal IN22 input to the gate of the transistor T30 is set to be a boosted potential higher than the external power source voltage Vp in the program mode, and is set to be 0 V in the read mode.

In the program mode, the input signal IN21 is set at a boosted potential level from the voltage Vc level (e.g., 5 V). For this reason, the potential of a node N25 connected to the source of the transistor T28 and the drain of the voltage conversion transistor T29 is increased toward the voltage Vp. The input signal IN21 is also supplied to the gate of the transistor T25, the drain of which is connected to the external power source Vp. Hence, the potential of a node N23 connected to the source of the transistor T25 and the drain of the depletion type transistor T26 is also increased toward the voltage Vp. The source and the gate of the transistor T26 are connected to a node N24 connected to the gate of the voltage conversion transistor T29 and the drain of the transistor T27. The above-mentioned controller serves as an inverting amplifier operated between the external power source Vp and the reference voltage generator VREF. A voltage corresponding to a difference between the internal power source voltage Vpp and the reference voltage VREF is output from the node N24 serving as an output terminal of the controller. The reference voltage generator output VREF is determined in accordance with the ratio of the resistances of the depletion type transistors T21 and T22. Polysilicon is used to form a resistor in the conventional circuit. However, the circuit according to the present invention has the advantage of using transistors to decrease pattern area.

The source of the voltage conversion transistor T29 and the drain of the transistor T30 are connected to a node N26. The signal IN22, supplied to the gate of the transistor T30, has a boosted potential higher than the external power source voltage in a program mode. The signal IN22 is set to be 0 V in a read mode.

To protect against breakdown of an oxide film because of micropatterning, a potential difference between the gate and the drain or the source of the transistor is decreased to weaken an electric field applied to the gate insulating film, thereby preventing destruction of the gate insulating film. More specifically, the voltage of the input signal IN21 is set to be 0 V in a read mode in the conventional circuit. However, the voltage of the signal IN21 is set at a voltage Vc level (e.g., 5 V) in the circuit of the present invention to decrease a potential difference with the external power source voltage Vp applied to the drain.

FIG. 30 shows an arrangement of a modification of the circuit shown in FIG. 29. In the embodiment shown in FIG. 30, the transistors T25 and T28 of the depletion type are used in place of those of the enhancement type. The gates of the depletion type transistors T28 and T25, the drain of each of which is connected to the external power source Vp, receive the input signal IN21 whose potential is set to be the voltage Vp or a boosted voltage higher than the voltage Vp in a program mode, and is set at the voltage Vc level (e.g., 5 V) in a read mode. Depletion type transistors T31 and T32 are connected to the sources of the transistors T28 and T25, respectively. The gates of the transistors T31 and T32 receive the signal IN22 whose potential is set to be the voltage Vp or a boosted potential higher than the voltage Vp in the program mode, and set to be 0 V in the read mode. The sources of the transistors T31 and T32 are connected to the drains of the voltage conversion transistor T29 and the control transistor T26, respectively.

A feature of the circuit of the present invention is that the levels of the signals IN21 and IN22 need not be boosted because depletion type transistors are used. In this arrangement, there is also provided a circuit wherein the gate insulating film is not destroyed, since a potential difference between the drain and the gate is decreased to weaken the electric field applied to the gate insulating film, even if the thickness of the oxide film is decreased.

FIG. 31 shows an arrangement of the control circuit 5 C110 for outputting the signals IN21 and IN22. Reference symbol <H> denotes a boosted voltage obtained from the voltage Vp or the voltage Vp itself. In this circuit, a signal H̄ is set at "0" in a data write mode, and the voltage <H> is supplied directly as the signals IN21 and IN22. In any mode except for the data write mode, the signal H̄ is set at "1", and a MOSFET T33 is turned on. The voltage of the signal IN22 is set to be 0 V, and the voltage of the signal IN21 is set to be lower than the voltage Vc by the threshold voltage (Vth38) of a transistor T38. A potential difference between the source and the gate of the transistor T38 is a difference between the voltage <H> and the voltage vc in FIG. 31, resulting in decreasing the electric field. When the transistor T33 is turned on, even if the voltage <H> is set at a high-voltage level, the potential difference between the gate and the drain of a transistor T37 is equal to the potential difference between the voltage <H> and the voltage (Vc−Vth38).

As described above, according to the arrangement shown in FIGS. 29 to 31, even if the elements are micropatterned under the condition that the externally supplied power source voltage is fixed, the gate insulating film of each element is not damaged, thus providing a highly reliable semiconductor integrated circuit.

Figure 8A:
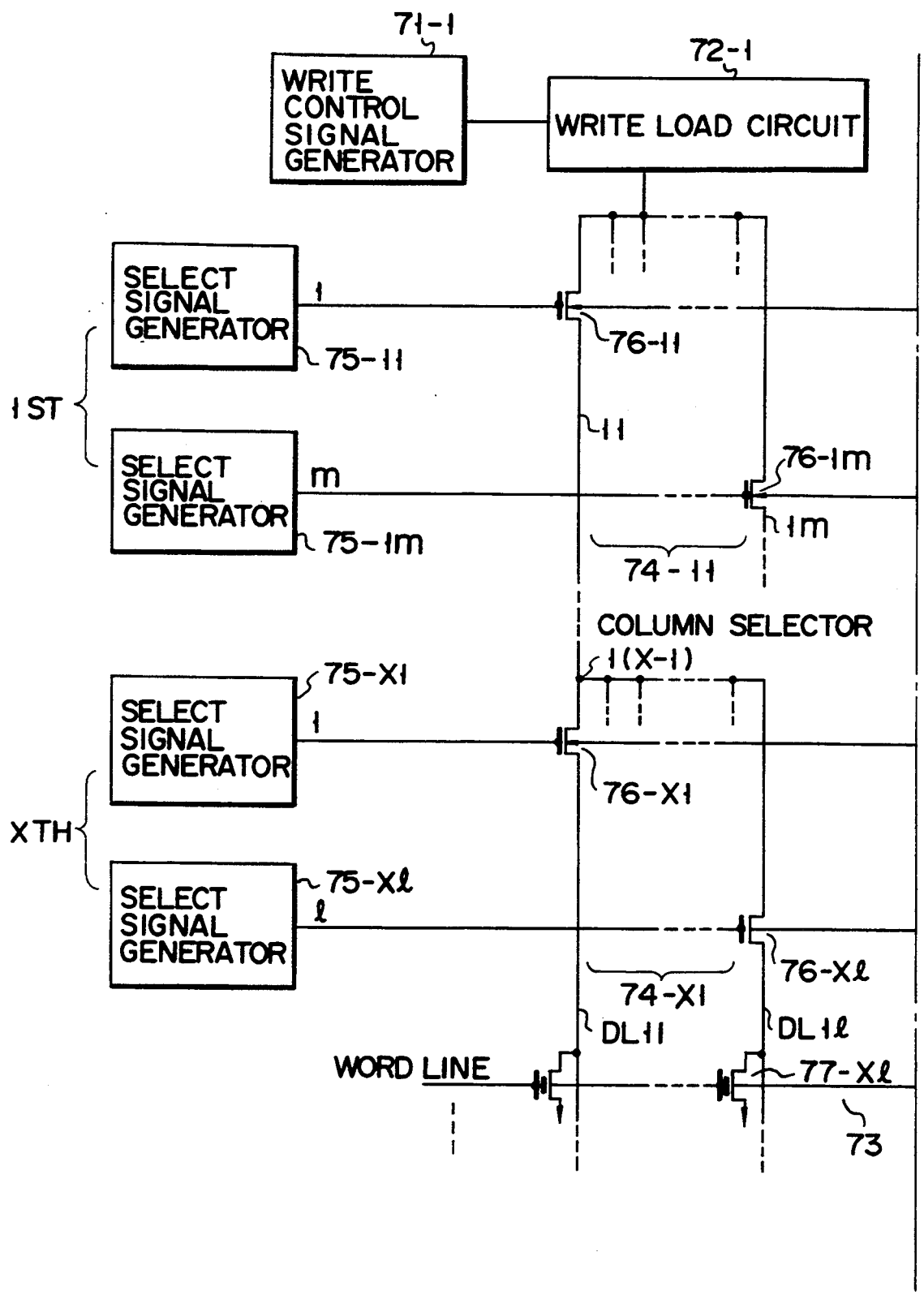
FIGS. 8A and 8B show an arrangement of the conventional nonvolatile semiconductor memory having a memory cell array.
Figure 8B:
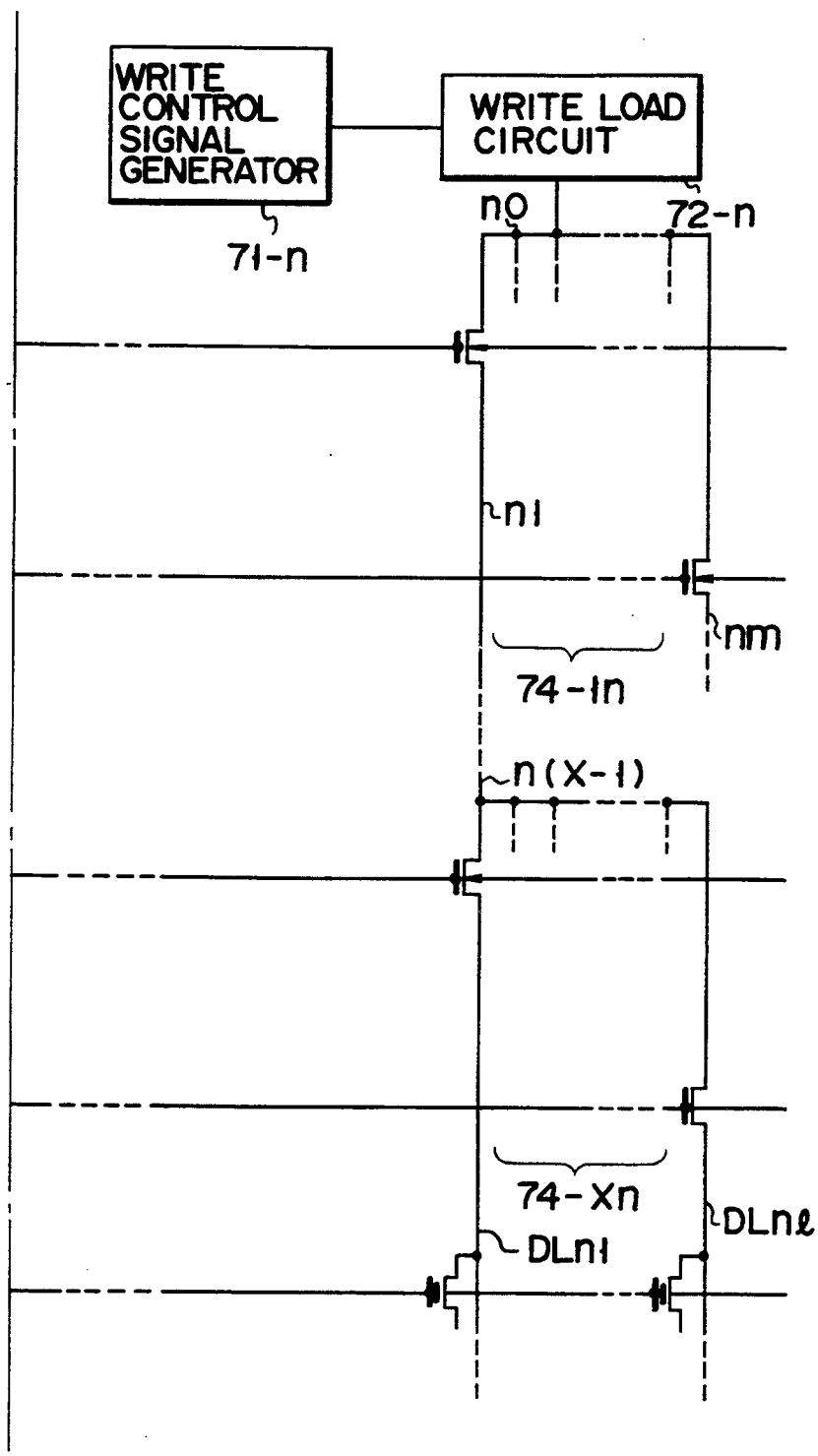
Figure 32B:
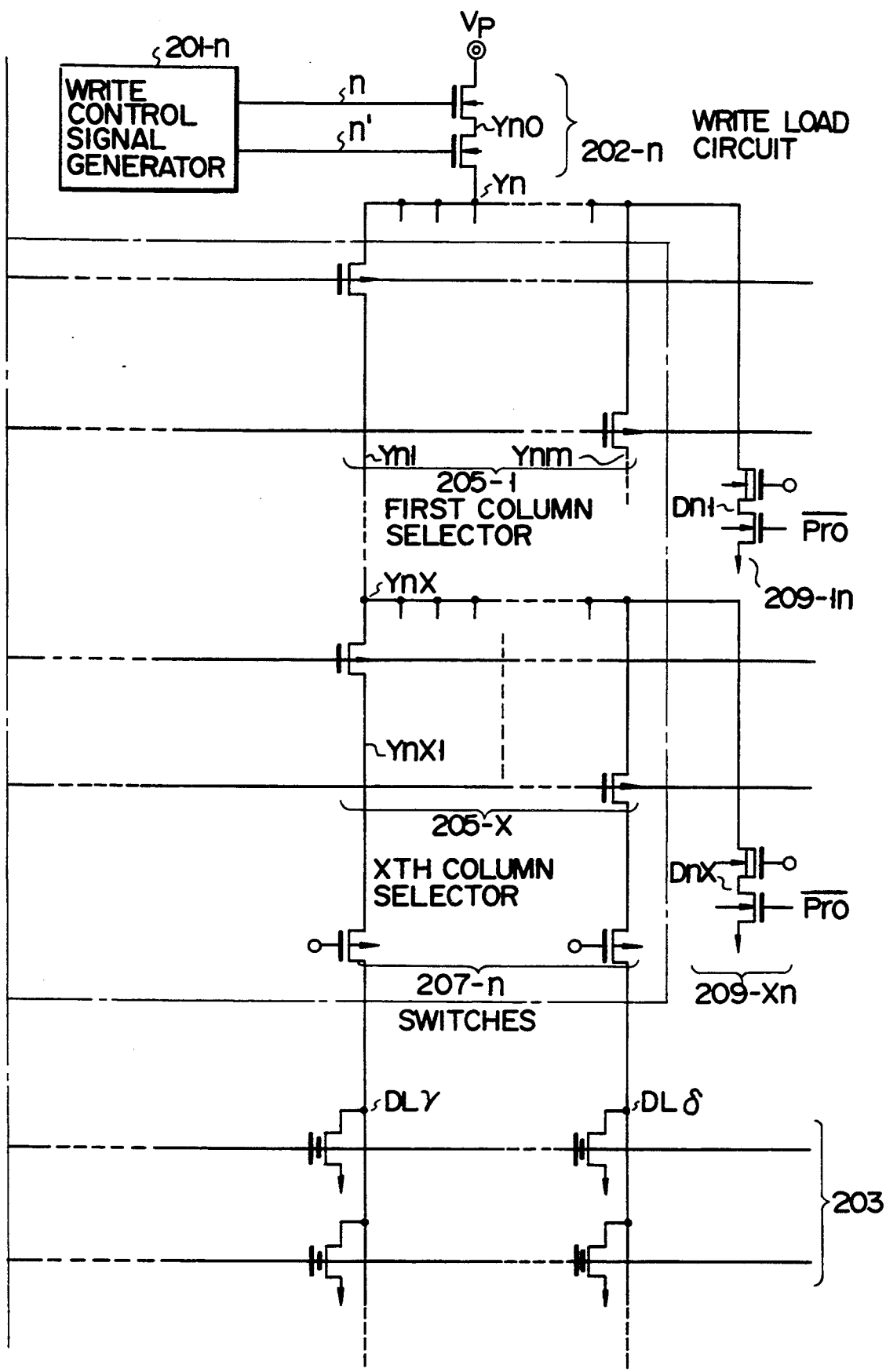

FIGS. 32A and 32B show an arrangement of an improvement of the semiconductor memory shown in FIGS. 8A and 8B. In this improvement, there is provided a write circuit including write control signal generators 201-1 to 201-n each having a different output state in accordance with states of data to be written. Write load circuits 202-1 to 202-n, each of which receives an output from the corresponding write control signal generator to generate a write voltage, write data in a nonvolatile semiconductor memory cell. Column selectors 204-1 to 204-x and 205-1 to 205-x, each having the first stage to the xth stage for selecting the corresponding data line in a nonvolatile semiconductor memory cell array 203, select signal generators 206-11 to 206-m, to 206-x1 to 206-l each having the first stage to the xth stages, for controlling the corresponding column selector. Switching circuits 207-1 to 207-n, each supply a predetermined write voltage to the corresponding data line commonly connected to the drains of the nonvolatile semiconductor memory cells. A substrate potential generator 208 generates different predetermined substrate potentials of the column selectors and the switching circuits in a write mode or a non-write mode. Dischargers 209-11 to 209-1n, to 209-x1 to 209-xn each discharge a potential of an input to each column selector in any mode except for the write mode. These column selectors are exclusively used in the write mode and column selectors used in the read mode are arranged in another location.

This arrangement has the following feature. Assume that each of outputs 1 and 1′ from the write control signal generator 201-1 has a high voltage (e.g., about 15 V), that an output n′ from the write control signal generator 201-n has a power source voltage (e.g., 5 V), that an output n′ has a ground voltage (e.g., 0 V), that only the select signal generator 206-11 is selected in the first select signal generator group, that other select signal generators in the first select signal generator group are in a non-selection state, and that the select signal generator 206-m represents the non-selected generators. Under these assumptions, the potential of an output terminal 11 of the select signal generator 206-11 is set to be the power source voltage (e.g., 5 V), and the potential of an output terminal m of the select signal generator 206-m is set to be a high voltage (e.g., about 15 V). Each of the outputs 1 and 1′ from the write control signal generator has a high voltage, and an output Y1 from the write load circuit 202-1 controlled by the outputs 1 and 1′ is set at a high-voltage level (e.g., about 11 V). In the first column selector 204-1, an output terminal Y11 of a p-channel enhancement type (to be referred to as a PE type hereinafter) transistor 211, the gate of which receives an output 11 from the select signal generator 206-11 selected by the first select signal generator, is set at a high-voltage level (e.g., 9 V), and an output terminal Y1m of a PE type transistor 212, the gate of which receives a non-selected select signal m, is in a floating state. An output terminal Yn of the write load circuit 202-n to which outputs n and n′ are supplied from the write control signal generator 201-n, is in a floating state, and a voltage is not applied to the output terminal Yn.

As described above, in the circuit having a drain to which a high voltage is applied, the voltage of the gate of, e.g., an element 211 is set to be 5 V (conventionally, 0 V) when it is selected to prevent destruction, degradation, or an operation error of elements due to a strong electric field. An output state of a gate signal is set to have a predetermined voltage, so that an electric field applied between the gate and the drain of the element is decreased, thus, providing a stable circuit.

Figure 34:
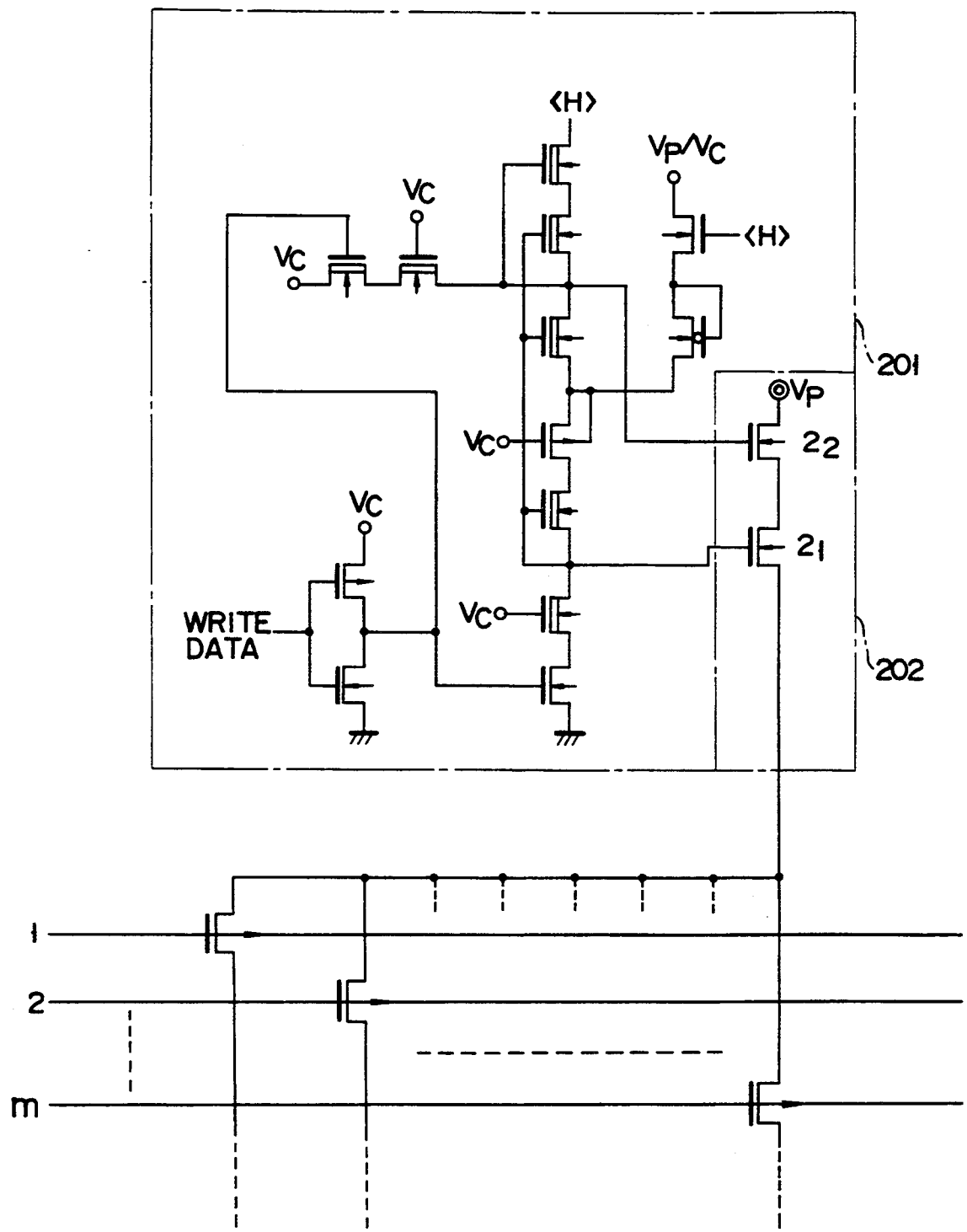
FIG. 34 a detailed arrangement of a write control signal generator and a write load circuit shown in FIG. 32A and 32B.
Figure 35B:
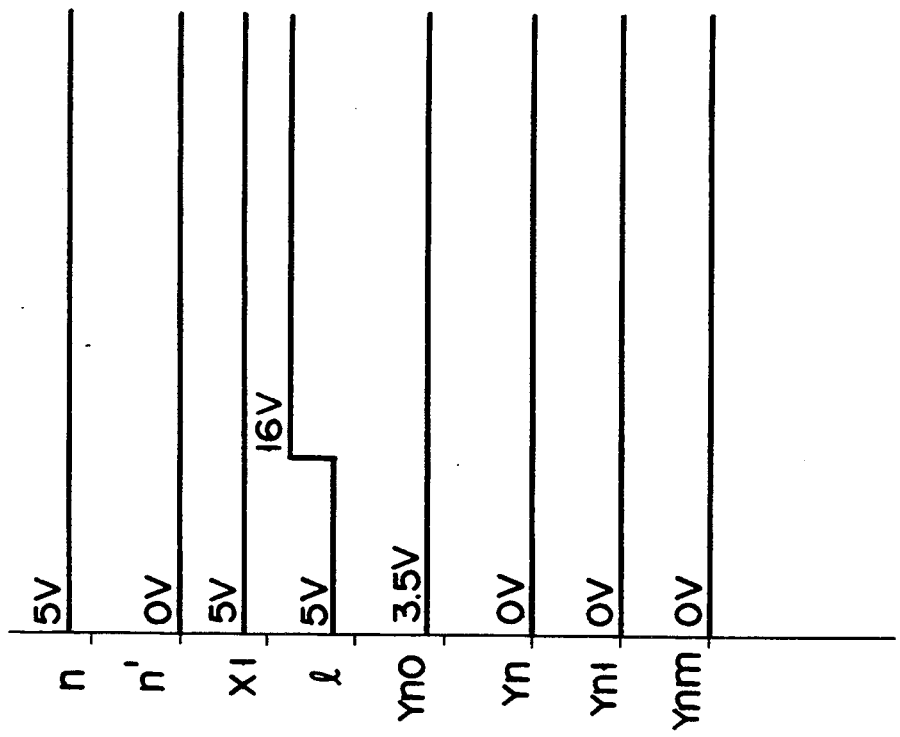
FIGS. 35A and 35B are timing charts of signals for explaining an operation of the improvement of FIBS. 32A and 32B.
Figure 35A:
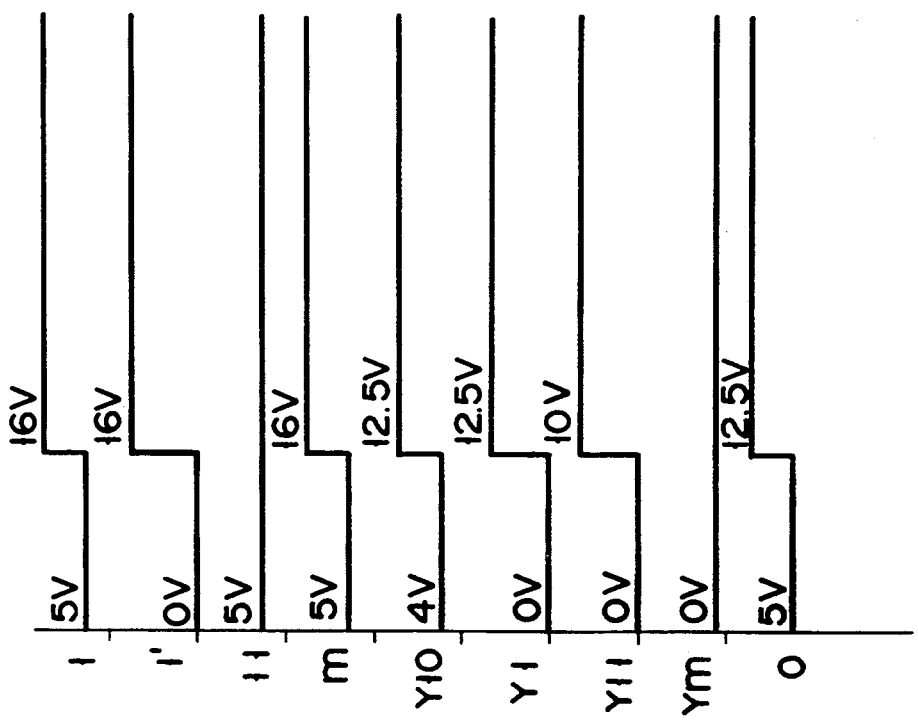

FIG. 33A shows a detailed arrangement of the select signal generator shown in FIGS. 32A and 32B. The substrate potential generator 208 outputs a high voltage in the program mode and the voltage Vc in the read mode and is realized by the circuit similar to that shown in FIG. 33A. FIG. 34 shows a detailed arrangement of the write control signal generator 201 and the write load circuit 202 shown in FIGS. 32A and 32B. These circuits are equivalent to those shown in FIG. 19. The power sources SW1 and SW2 in FIG. 9 correspond to power sources <H> and Vp/Vc, respectively. FIGS. 35A and 35B show waveform charts of the signals shown in FIG. 34.

FIGS. 36A and 36B show a modification of the improvement in FIGS. 32A and 32B. This modification has a write circuit including the write control signal generators 201-1 to 201-n having different output states in accordance with states of data to be written. Write load circuits 202-1 to 202-n each receives an output from the corresponding write control signal generator for generating a predetermined write voltage to write data in a nonvolatile semiconductor memory element. First to xth column selector groups 204-1 to 204-x and 205-1 to 205-x and first to xth selection signal generator groups 206-11, to 206-m and 206-x1 to 206-l select corresponding nonvolatile memory cells MC in which data is written in the cell array 203. Selecting first to xth selection signal modulators 221-1 to 221-n and 221-1 to 222-x receive outputs from the first to xth selection signal generators 206-11 to 206-m and 206-x1 to 206-l and output column select signals for selecting the corresponding column selector groups. Each column select signal is controlled in response to a next-stage column select signal modulated (controlled) by a transistor, e.g., 220, for receiving as its gate input, e.g., an output 1 from the write control signal generator, e.g., 201-1.

This improvement has the following feature. Assume that write signals are output when each of the write control signals 1 and 1' has a high voltage (e.g., about 15 V), a write control signal n has a power source voltage (e.g., 5 V), and a write control signal n' has a ground voltage (e.g., 0 V), the selection signal generator, e.g., 206-11, is selected in the first selection signal generator group, other first selection signal generators are in a non-selection state, and the selection signal generator 206-m represents the nonselected generators. When both output terminals 11 and 11' of the selection signal generator 206-11 are in a selection state having a high voltage (e.g., about 15 V), an output m from the selection signal generator 206-m has a power source voltage (e.g., 5 V), and an output m' is set in a nonselection state having a ground voltage (e.g., 0 V), outputs 111 and 111' from the first selection signal modulator which are respectively supplied to the gates of n-channel enhancement type (to be referred to as an NE type hereinafter) transistors 123 (for a resistor) and 124 (for a switch) in the NE type transistors constituting the first column selector group, are set at a high-potential level (e.g., about 15 v) in response to the output from the selection signal generator 206-11 and the output 1 from the write control signal generator 201-1. The output terminal Y11 of the write load circuit 202-1 is set at a high-voltage level (e.g., about 11 V) in response to the write control signals 1 and 1'. Therefore, a source Y1112 of the NE type transistor 124 serving as one of the output terminals of the first column selector group, is set at a high potential level (e.g., about 10 V). Outputs m1 and m1' from the first selection signal modulator 221-1 which are supplied to the gates of the NE type transistors 125 and 126 of the NE type transistors constituting the first column selector group, receive the outputs m and m' from the selection signal generator 206-m, and the output 1 from the write control signal generator 201-1. A gate terminal m1 of the NE type transistor 125 has a power source voltage (e.g., 5 V), and the gate terminal m1', has a ground voltage (e.g., 0 V). Even if the output terminal Y11 of the write load circuit 202-1 has a high voltage (e.g., 11 V), the electric field generated across the gate and the drain of the NE type transistor 125 constituting the first column selector 204-1 is weakened. The potential of a source terminal Y11m of the transistor 125 is set to be a predetermined voltage (e.g., about 3 V), and the electric field generated across the drain and the gate having a voltage of 0 V of the transistor 126 is decreased. A source Y11m2 of the n-channel transistor 126 serving as one of the output terminals of the first column selector group 204-1 has a ground voltage (e.g., 0 V). When the output n from the write control signal generator 201-n has a power source voltage (e.g., 5 V) and the output n' has a ground voltage (e.g., 0 V), an output Yn1 of the write load circuit has a ground voltage (e.g., 0 V) in response to the output from the write control signal generator 201-n. Since the output n from the write control signal generator has a power source voltage (e.g., 5 V), the potential of each of the outputs 11 and 11' in a selection state is high. However, an output 11n from the first selection signal modulator 221-n is set to be about a predetermined voltage (e.g., 6 V). The potential of an output 11n' is set to be a predetermined voltage (e.g., 7 V). An electric field between the gate and the channel can also be decreased when data is not written. The potential of an output mn from the first selection signal modulator is set to be a predetermined voltage (e.g., about 2 V) in response to the outputs m and m' from the selection signal generator 206-m, and the potential of output mn' is set to be a ground voltage (e.g., 0 V). All outputs Yn12, Ynm2, and the like from the first column selector group are set at ground voltage level.

A detailed arrangement of the selection signal generator shown in FIGS. 36A and 36B is shown in FIG. 33B.

As has been described above, in the circuit wherein a high voltage is applied to the drain of the transistor, in order to protect elements from destruction, degradation, and an operation error due to a strong electric field, an element whose gate is biased at a predetermined voltage (e.g., 5 V) is inserted in the drain. Therefore, the strong electric field can be decreased, thus providing a stable circuit.

Figure 38B:
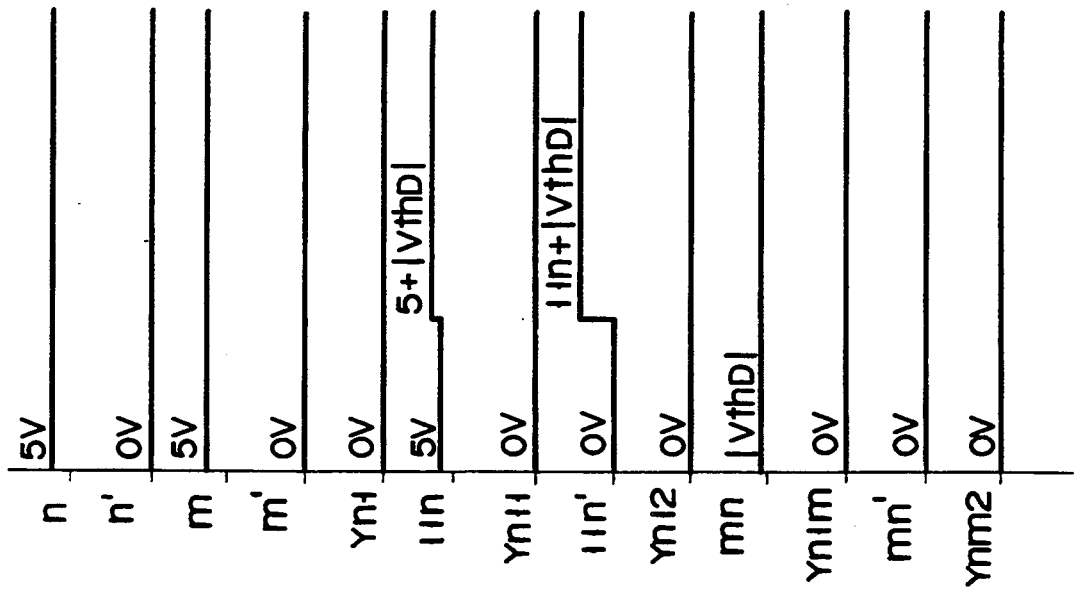
FIGS. 38A and 38B are signal waveform charts for explaining an operation of the modification in FIGS. 36A and 36B.
Figure 38A:
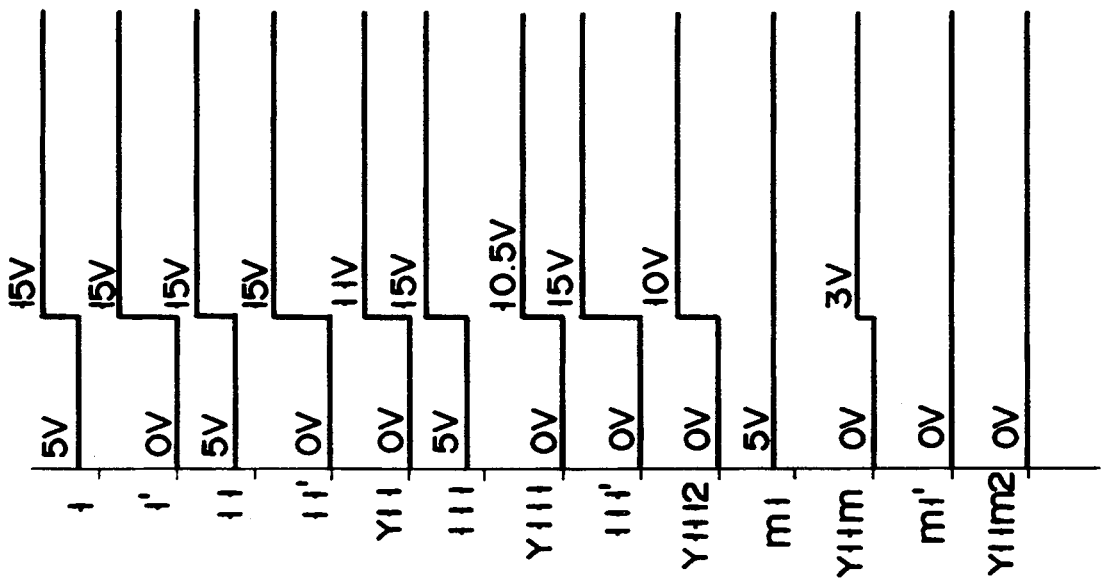

FIG. 37 shows a detailed arrangement of the write control signal generator 201 and the write load circuit 202. These circuits are the same as those in FIG. 34. FIGS. 38A and 38B are waveform charts of the signals shown in FIG. 37.

What is claimed is:

1. A semiconductor integrated circuit, comprising:
a first supply potential terminal for supplying a first supply potential;
first and second transistors connected in series between said first supply potential terminal and an output node, and respectively having first and second gates; and
control means for receiving a data signal, and for supplying a first potential equal to said first supply potential to said first and second gates of said first and second transistors when the data signal is a first logic value, and for supplying a ground potential to said second gate of said second transistor and a second potential to said first gate of said first transistor when the data signal is a second logic value, the second potential being lower than the first potential and higher than the ground potential;
wherein said first transistor is protected from element breakdown by reducing an electric field between a gate and one of a source and drain of said first transistor.

2. A semiconductor integrated circuit for increasing a drain breakdown voltage of a metal oxide semiconductor (MOS) field effect transistor comprising:
a first supply potential terminal for supplying a first potential as a program potential in a program mode;
first and second MOS transistors connected in series between said first supply potential terminal and an output node;
boosting means, connected to said first supply potential terminal, for boosting the first potential to a second potential; and
control means for receiving a data signal, and for applying the second potential to gates of said first and second MOS transistors in a program mode when the received data signal is a first logic value, and for applying a third potential to a gate of said second MOS transistor and a fourth potential to the gate of said first MOS transistor in program mode when the received data signal is set at a second logic value, said fourth potential being lower than the first potential and higher than the third potential, the third potential corresponding to ground potential.

3. A semiconductor integrated circuit for increasing a drain breakdown voltage of a metal oxide semiconductor (MOS) field effect transistor comprising:
a first supply potential terminal for supplying a first potential as a program potential in a program mode;
first and second MOS transistors connected in series between said first supply potential terminal and an output node; and
control means for receiving a data signal to apply the first potential to gates of said first and second MOS transistors in a program mode, when the received data signal is a first logic value, and to apply a second potential to a gate of said second MOS transistor and to apply a third potential to the gate of said first MOS transistor in a program mode when the received data signal is set at a second logic value, said third potential being lower than the first potential and higher than the second potential, the second potential corresponding to a ground potential.

4. A semiconductor integrated circuit comprising:
a first supply potential terminal for supplying a first potential;
a second supply potential terminal for supplying a second potential, wherein the second potential is lower than the first potential, and the second potential is higher than a ground potential;
a third supply potential terminal for supplying a third potential, wherein the third potential is higher than the second potential;
a first transistor having a drain, a source, and a gate, the drain of the first transistor being connected to the first supply potential terminal, wherein a potential equal to the first potential is output from the source of the first transistor in response to a data signal;
control means for selectively supplying one of the second potential and the third potential to the gate of the first transistor in response to the data signal, said control means including a second transistor and a third transistor, the second transistor having a drain, a source, and a gate, the drain of the second transistor being connected to the second supply potential terminal, the source of the second transistor being connected to the gate of the first transistor, the third transistor having a drain, a source, and a gate, the drain of the third transistor being connected to the third supply potential terminal, the source of the third transistor being connected to the gate of the first transistor, said control means controlling a potential supplied to the gates of the second and third transistors in response to the data signal;
wherein the potential difference between the gate of the first transistor and one of the source and drain of the first transistor is set to be lower than the first potential when the first and second potentials are supplied to the gate of the first transistor, in order to reduce an electric field between the gate of the first transistor and one of the source and drain of the first transistor, thereby preventing the first transistor from element breakdown.

5. A semiconductor integrated circuit according to claim 4, wherein a potential difference between the drain and gate of the second transistor is lower than the first potential, and a potential difference between the drain and gate of the third transistor is lower than the first potential.

* * * * *